(12) United States Patent
Scheuerlein et al.

(10) Patent No.: US 8,279,704 B2
(45) Date of Patent: *Oct. 2, 2012

(54) DECODER CIRCUITRY PROVIDING FORWARD AND REVERSE MODES OF MEMORY ARRAY OPERATION AND METHOD FOR BIASING SAME

(75) Inventors: Roy E. Scheuerlein, Cupertino, CA (US); Luca G. Fasoli, Campbell, CA (US)

(73) Assignee: SanDisk 3D LLC, Milpitas, CA (US)

( * ) Notice: Subject to any disclaimer, the term of this patent is extended or adjusted under 35 U.S.C. 154(b) by 163 days.

This patent is subject to a terminal disclaimer.

(21) Appl. No.: 12/895,523

(22) Filed: Sep. 30, 2010

(65) Prior Publication Data

US 2011/0019495 A1    Jan. 27, 2011

Related U.S. Application Data

(63) Continuation-in-part of application No. 12/396,461, filed on Mar. 2, 2009, now Pat. No. 8,004,927, which is a continuation of application No. 11/461,369, filed on Jul. 31, 2006, now Pat. No. 7,499,366.

(51) Int. Cl.
*G11C 8/00* (2006.01)

(52) U.S. Cl. ......... 365/230.06; 365/230.03; 365/230.08; 365/189.11

(58) Field of Classification Search ............. 365/230.06, 365/189.11, 230.08, 230.03
See application file for complete search history.

(56) References Cited

U.S. PATENT DOCUMENTS

| | | | |
|---|---|---|---|
| 2,632,058 A | 3/1953 | Gray | |
| 3,761,896 A | 9/1973 | Davidson | |
| 4,247,918 A | 1/1981 | Iwahashi et al. | |
| 4,879,692 A | 11/1989 | Tokushige | |
| 5,039,882 A | 8/1991 | Arakawa | |
| 5,513,147 A | 4/1996 | Prickett, Jr. | |
| 5,537,362 A | 7/1996 | Gill et al. | |
| 5,541,869 A | 7/1996 | Rose et al. | |
| 5,587,959 A | 12/1996 | Tsukude | |
| 5,627,792 A | 5/1997 | Tsujimoto | |
| 5,646,879 A | 7/1997 | Harshfield | |
| 5,663,907 A | 9/1997 | Frayer et al. | |

(Continued)

FOREIGN PATENT DOCUMENTS

EP    0401792 A2    12/1990

(Continued)

OTHER PUBLICATIONS

Supplementary European Search Report and Written Opinion mailed Oct. 1, 2010 in EP App. No. 07840623, 5 pages.

(Continued)

*Primary Examiner* — Pho M Luu
(74) *Attorney, Agent, or Firm* — Zagorin O'Brien Graham LLP

(57) ABSTRACT

Circuits and methods are described for decoding exemplary memory arrays of programmable and, in some embodiments, re-writable passive element memory cells, which are particularly useful for extremely dense three-dimensional memory arrays having more than one memory plane. In addition, circuits and methods are described for selecting one or more array blocks of such a memory array, for selecting one or more word lines and bit lines within selected array blocks, for conveying data information to and from selected memory cells within selected array blocks, and for conveying unselected bias conditions to unselected array blocks.

20 Claims, 16 Drawing Sheets

U.S. PATENT DOCUMENTS

| | | | |
|---|---|---|---|
| 5,666,304 | A | 9/1997 | Hikawa et al. |
| 5,668,758 | A | 9/1997 | Yiu et al. |
| 5,673,224 | A | 9/1997 | Chevallier et al. |
| 5,781,493 | A | 7/1998 | Kobayashi |
| 5,796,656 | A | 8/1998 | Kowshik et al. |
| 5,818,764 | A | 10/1998 | Yiu et al. |
| 5,831,924 | A | 11/1998 | Nitta et al. |
| 5,886,923 | A | 3/1999 | Hung |
| 5,911,062 | A | 6/1999 | Taki |
| 5,915,167 | A | 6/1999 | Leedy |
| 5,949,735 | A | 9/1999 | Jeong |
| 5,978,277 | A | 11/1999 | Hsu et al. |
| 6,026,028 | A | 2/2000 | Lin et al. |
| 6,034,882 | A | 3/2000 | Johnson et al. |
| 6,034,913 | A | 3/2000 | Freimuth |
| 6,049,486 | A | 4/2000 | Lee et al. |
| 6,072,716 | A | 6/2000 | Jacobson et al. |
| 6,122,200 | A | 9/2000 | Campardo et al. |
| 6,134,150 | A | 10/2000 | Hsu et al. |
| 6,229,845 | B1 | 5/2001 | Chan |
| 6,356,482 | B1 | 3/2002 | Derhacobian et al. |
| 6,385,074 | B1 | 5/2002 | Johnson et al. |
| 6,420,215 | B1 | 7/2002 | Knall et al. |
| 6,438,041 | B1 | 8/2002 | Yamada et al. |
| 6,473,332 | B1 | 10/2002 | Ignatiev et al. |
| 6,477,088 | B2 | 11/2002 | Ogura et al. |
| 6,490,218 | B1 | 12/2002 | Vyvoda et al. |
| 6,498,752 | B1 | 12/2002 | Hsu et al. |
| 6,525,953 | B1 | 2/2003 | Johnson |
| 6,525,970 | B2 | 2/2003 | Wang et al. |
| 6,535,430 | B2 | 3/2003 | Ogura et al. |
| 6,545,898 | B1 | 4/2003 | Scheuerlein |
| 6,570,786 | B2 | 5/2003 | Lee |
| 6,614,693 | B1 | 9/2003 | Lee et al. |
| 6,618,295 | B2 | 9/2003 | Scheuerlein |
| 6,621,745 | B1 | 9/2003 | Manea |
| 6,628,564 | B1 | 9/2003 | Takita et al. |
| 6,631,085 | B2 | 10/2003 | Kleveland et al. |
| 6,633,508 | B2 | 10/2003 | Muranaka et al. |
| 6,704,235 | B2 | 3/2004 | Knall et al. |
| 6,711,068 | B2 | 3/2004 | Subramanian et al. |
| 6,735,104 | B2 | 5/2004 | Scheuerlein |
| 6,753,561 | B1 | 6/2004 | Rinerson et al. |
| 6,757,784 | B2 | 6/2004 | Lu et al. |
| 6,765,813 | B2 | 7/2004 | Scheuerlein et al. |
| 6,778,437 | B1 | 8/2004 | Achter et al. |
| 6,791,878 | B2 | 9/2004 | Jeong |
| 6,795,340 | B2 | 9/2004 | Sakimura et al. |
| 6,801,448 | B2 | 10/2004 | Hsu |
| 6,804,148 | B2 | 10/2004 | Bedarida et al. |
| 6,807,103 | B2 | 10/2004 | Cavaleri et al. |
| 6,831,854 | B2 | 12/2004 | Rinerson et al. |
| 6,834,008 | B2 | 12/2004 | Rinerson et al. |
| 6,841,833 | B2 | 1/2005 | Hsu et al. |
| 6,850,429 | B2 | 2/2005 | Rinerson et al. |
| 6,856,536 | B2 | 2/2005 | Rinerson et al. |
| 6,856,572 | B2 | 2/2005 | Scheuerlein et al. |
| 6,859,382 | B2 | 2/2005 | Rinerson et al. |
| 6,859,410 | B2 * | 2/2005 | Scheuerlein et al. .... 365/230.06 |
| 6,862,223 | B1 | 3/2005 | Lee et al. |
| 6,868,034 | B2 | 3/2005 | La et al. |
| 6,879,505 | B2 | 4/2005 | Scheuerlein |
| 6,881,623 | B2 | 4/2005 | Campbell et al. |
| 6,906,939 | B2 | 6/2005 | Rinerson et al. |
| 6,909,632 | B2 | 6/2005 | Rinerson et al. |
| 6,917,539 | B2 | 7/2005 | Rinerson et al. |
| 6,927,411 | B2 | 8/2005 | Kozicki |
| 6,952,030 | B2 | 10/2005 | Herner et al. |
| 6,952,043 | B2 | 10/2005 | Vyvoda et al. |
| 6,965,137 | B2 | 11/2005 | Kinney et al. |
| 7,002,825 | B2 * | 2/2006 | Scheuerlein .................... 365/51 |
| 7,038,935 | B2 | 5/2006 | Rinerson et al. |
| 7,046,577 | B2 | 5/2006 | Leconte et al. |
| 7,054,219 | B1 | 5/2006 | Petti et al. |
| 7,057,922 | B2 | 6/2006 | Fukumoto |
| 7,079,417 | B2 | 7/2006 | Nam et al. |
| 7,106,652 | B2 * | 9/2006 | Scheuerlein ............ 365/230.06 |
| 7,142,471 | B2 | 11/2006 | Fasoli et al. |
| 7,152,138 | B2 | 12/2006 | Spencer et al. |
| 7,177,169 | B2 * | 2/2007 | Scheuerlein .................... 365/51 |
| 7,177,181 | B1 | 2/2007 | Scheuerlein |
| 7,177,193 | B2 | 2/2007 | Forbes |
| 7,233,024 | B2 | 6/2007 | Scheuerlein et al. |
| 7,272,052 | B2 | 9/2007 | Scheuerlein et al. |
| 7,283,403 | B2 | 10/2007 | Johnson |
| 7,283,420 | B2 | 10/2007 | Kim |
| 7,286,439 | B2 | 10/2007 | Fasoli et al. |
| 7,298,665 | B2 | 11/2007 | So et al. |
| 7,362,604 | B2 | 4/2008 | Scheuerlein |
| 7,426,128 | B2 | 9/2008 | Scheuerlein |
| 7,499,366 | B2 * | 3/2009 | Scheuerlein et al. .... 365/230.06 |
| 7,554,832 | B2 | 6/2009 | Fasoli et al. |
| 8,004,927 | B2 * | 8/2011 | Scheuerlein et al. .... 365/230.06 |
| 2002/0027794 | A1 | 3/2002 | Gudesen et al. |
| 2002/0131309 | A1 | 9/2002 | Nishihara et al. |
| 2002/0154531 | A1 | 10/2002 | Lowrey et al. |
| 2002/0196669 | A1 | 12/2002 | Hsu et al. |
| 2003/0021148 | A1 | 1/2003 | Scheuerlein |
| 2003/0026120 | A1 | 2/2003 | Scheuerlein |
| 2003/0047765 | A1 | 3/2003 | Campbell |
| 2003/0053332 | A1 | 3/2003 | Kleveland et al. |
| 2003/0230733 | A1 | 12/2003 | Tanaka |
| 2004/0156259 | A1 | 8/2004 | Ninomiya et al. |
| 2005/0041468 | A1 | 2/2005 | Mihnea et al. |
| 2005/0052915 | A1 | 3/2005 | Herner et al. |
| 2005/0083747 | A1 | 4/2005 | Tang et al. |
| 2005/0141329 | A1 | 6/2005 | Beat |
| 2005/0158950 | A1 | 7/2005 | Scheuerlein et al. |
| 2005/0201148 | A1 | 9/2005 | Chen et al. |
| 2005/0276091 | A1 | 12/2005 | Inoue |
| 2006/0140002 | A1 | 6/2006 | Kim et al. |
| 2006/0145135 | A1 | 7/2006 | Huang et al. |
| 2006/0146639 | A1 | 7/2006 | Fasoli et al. |
| 2006/0250836 | A1 | 11/2006 | Herner et al. |
| 2006/0250837 | A1 | 11/2006 | Herner et al. |
| 2006/0273298 | A1 | 12/2006 | Petti |
| 2007/0007579 | A1 | 1/2007 | Scheuerlein et al. |
| 2007/0069276 | A1 | 3/2007 | Scheuerlein et al. |
| 2007/0070690 | A1 | 3/2007 | Scheuerlein et al. |
| 2007/0072360 | A1 | 3/2007 | Kumar et al. |
| 2007/0090425 | A1 | 4/2007 | Kumar et al. |
| 2007/0236981 | A1 | 10/2007 | Herner |
| 2008/0023790 | A1 | 1/2008 | Scheuerlein |
| 2008/0025061 | A1 | 1/2008 | Scheuerlein et al. |
| 2008/0025062 | A1 | 1/2008 | Scheuerlein et al. |
| 2008/0025067 | A1 | 1/2008 | Scheuerlein et al. |
| 2008/0025068 | A1 | 1/2008 | Scheuerlein et al. |
| 2008/0025069 | A1 | 1/2008 | Scheuerlein et al. |
| 2008/0025076 | A1 | 1/2008 | Scheuerlein |
| 2008/0025077 | A1 | 1/2008 | Scheuerlein |
| 2008/0025078 | A1 | 1/2008 | Scheuerlein et al. |
| 2008/0025085 | A1 | 1/2008 | Scheuerlein et al. |
| 2008/0025088 | A1 | 1/2008 | Scheuerlein et al. |
| 2008/0025089 | A1 | 1/2008 | Scheuerlein et al. |
| 2008/0025093 | A1 | 1/2008 | Scheuerlein et al. |
| 2008/0025094 | A1 | 1/2008 | Scheuerlein et al. |
| 2008/0025118 | A1 | 1/2008 | Scheuerlein |
| 2008/0025131 | A1 | 1/2008 | Scheuerlein et al. |
| 2008/0025132 | A1 | 1/2008 | Fasoli et al. |
| 2008/0025133 | A1 | 1/2008 | Scheuerlein et al. |
| 2008/0025134 | A1 | 1/2008 | Scheuerlein et al. |
| 2008/0159053 | A1 | 7/2008 | Yan et al. |

FOREIGN PATENT DOCUMENTS

| | | |
|---|---|---|
| EP | 1557841 A | 7/2005 |
| WO | 2008016948 A2 | 2/2008 |

OTHER PUBLICATIONS

International Search Report and Written Opinion, mailed Jan. 2, 2012 in PCT/US2011/050012, 17 pages.

Baek et al., "Highly Scalable Non-volatile Resistive Memory using Simple Binary Oxide Driven by Asymmetric Unipolar Voltage Pulses," IEEE International Electron Devices Meeting Technical Digest, Dec. 2004, pp. 587-590 (4 pages).

Baek et al., "Multi-layer Cross-point Binary Oxide Resistive Memory (OxRRAM) for Post-NAND Storage Application," IEEE International Electron Devices Meeting Technical Digest, Dec. 2005, pp. 750-753 (4 pages).

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, (5 pages).

Cappelletti, P. et al. "Flash Memories," Kluwer Academic Publishers, Jan. 2, 1999, pp. 373-382.

Hwang et al., "Writing Current Reduction for High-Density Phase-Change RAM," IEEE International Electron Devices Meeting Technical Digest, Dec. 2003, pp. 893-896 (4 pages).

Lee, Seungjae et al., "A 3.3V 4Gb Four-Level NAND Flash Memory with 90nm CMOS Technology", IEEE Int'l Solid-State Circuits Conference, 2004, Non-Volatile Memory/2.7, Feb. 2004, (13 pages).

Pirovano et al., "Electronic Switching in Phase-Change Memories," IEEE Transactions on Electronic Devices, vol. 51, No. 3, Mar. 2004, pp. 452-459 (8 pages).

Zhuang, W. W., et al., "Novel Colossal Magnetoresistive Thin Film Nonvolatile Resistance Random Access Memory (RRAM)," IEEE XPLORE, International Electron Devices Meeting, Dec. 8, 2002, pp. 193-196.

* cited by examiner

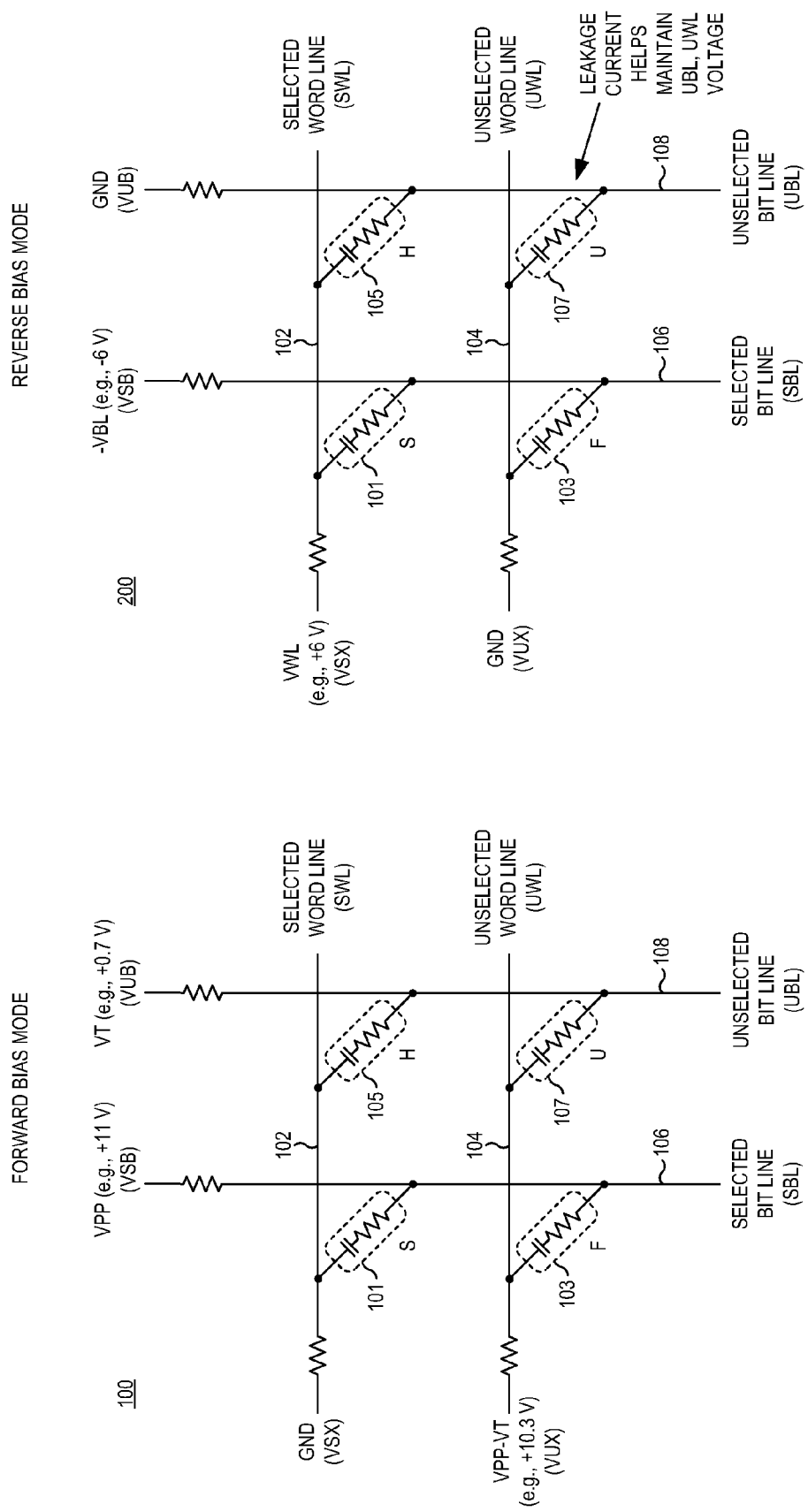

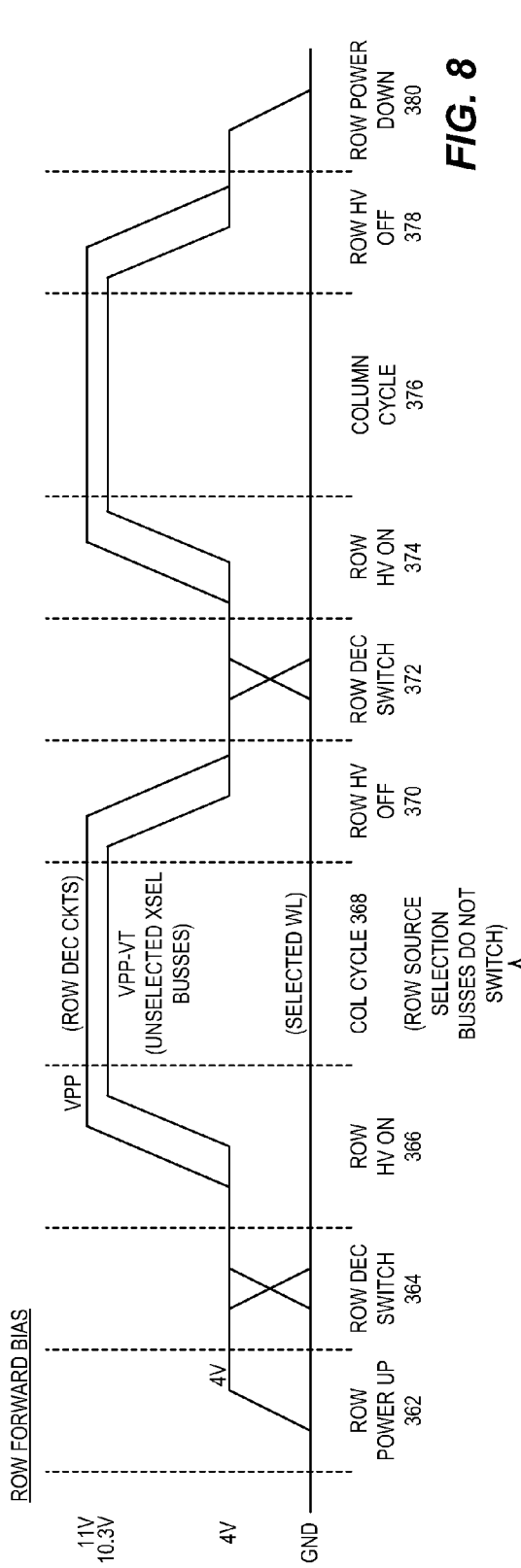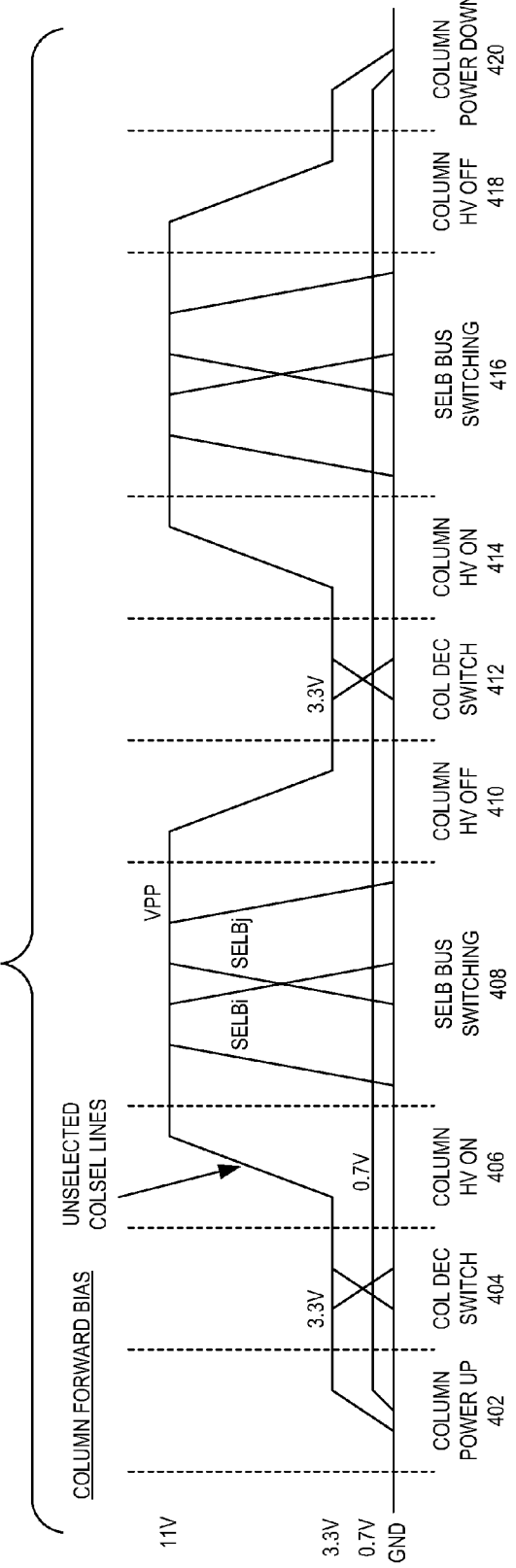

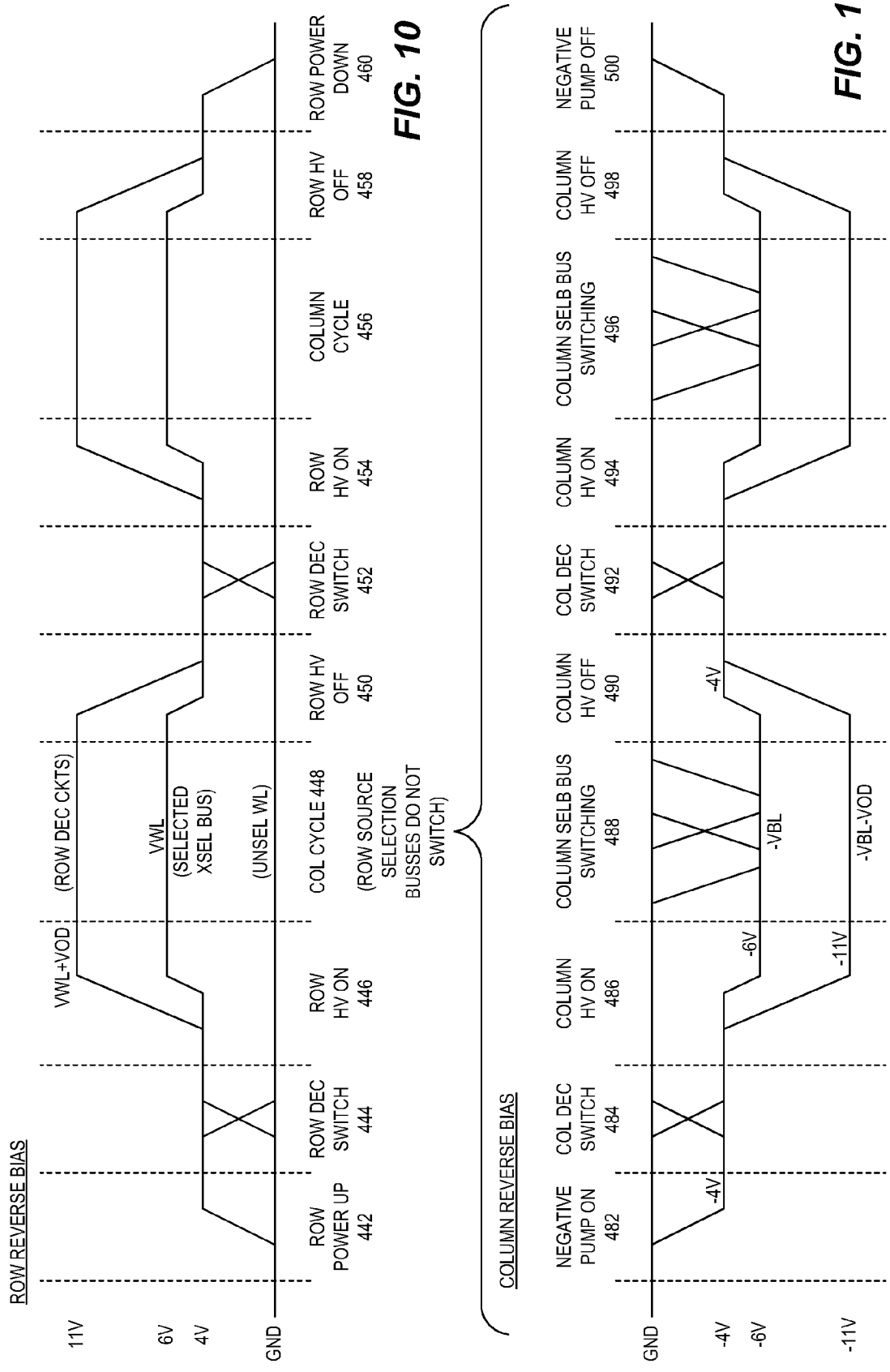

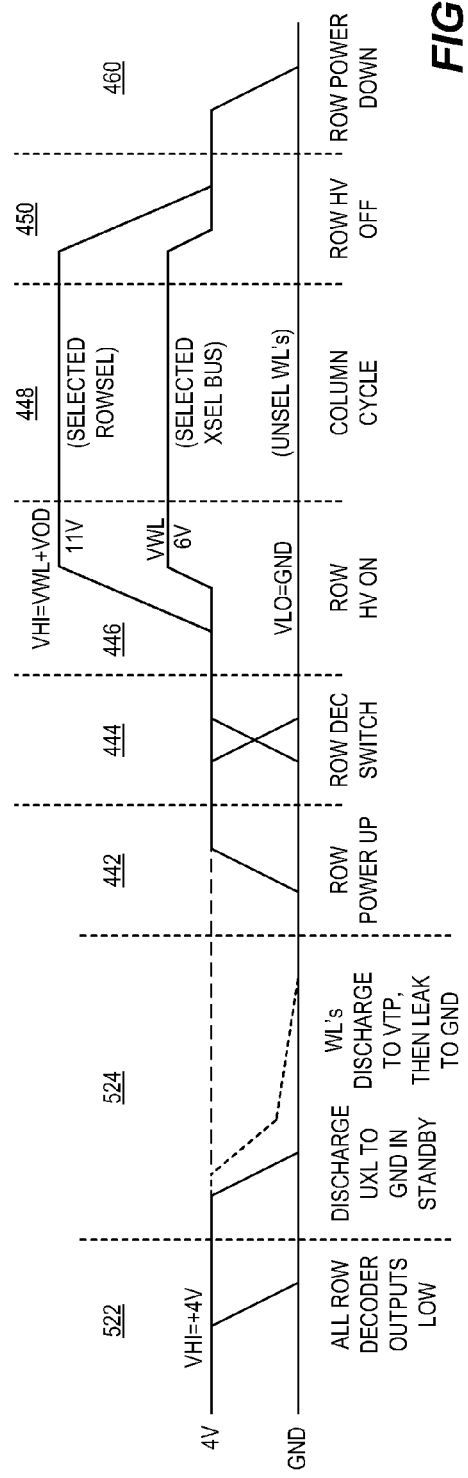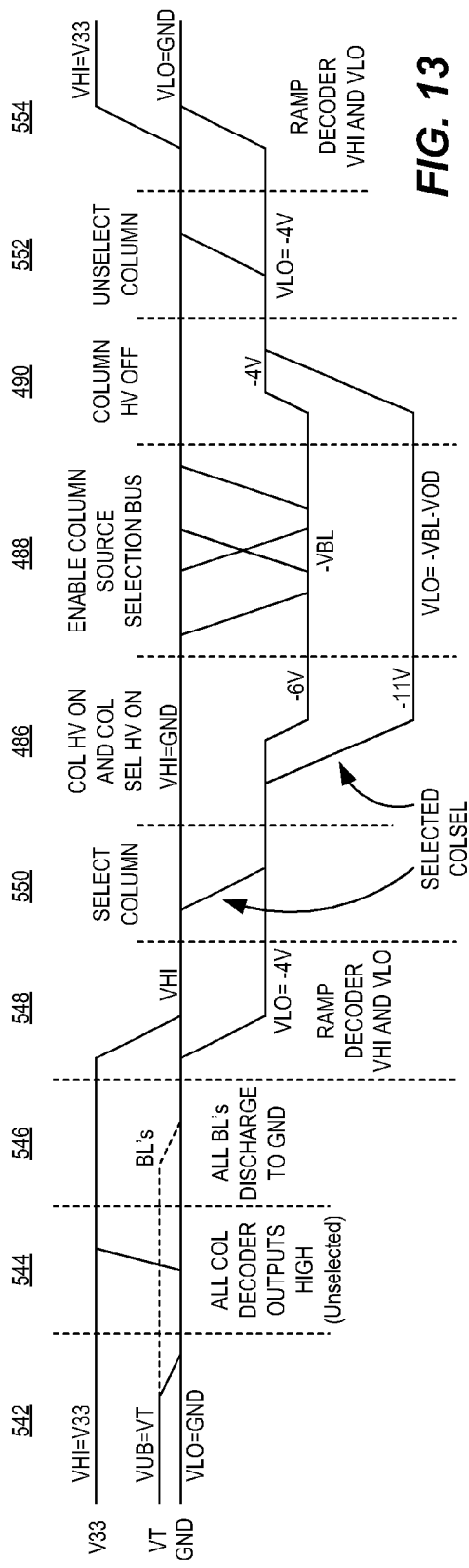

DECODER CIRCUITRY PROVIDING FORWARD AND REVERSE MODES OF MEMORY ARRAY OPERATION AND METHOD FOR BIASING SAME

CROSS-REFERENCE TO RELATED APPLICATION(S)

This application is a continuation-in-part application of U.S. patent application Ser. No. 12/396,461 filed on Mar. 2, 2009 and entitled "Reversible-Polarity Decoder Circuit and Method, now U.S. Pat. No. 8,004,927, which is a continuation application of U.S. patent application Ser. No. 11/461,369 filed on Jul. 31, 2006 and entitled "Method for Using Dual Data-Dependent Busses for Coupling Read/Write Circuits to a Memory Array" by Roy E. Scheuerlein and Luca G. Fasoli, now U.S. Pat. No. 7,499,366, which applications are hereby incorporated by reference in their entirety.

BACKGROUND

1. Field of the Invention

The present invention relates to programmable memory arrays, and particularly semiconductor integrated circuit memory arrays incorporating passive element memory cells, and even more particularly a three-dimensional memory array incorporating such memory cells.

2. Description of the Related Art

Certain passive element memory cells exhibit re-writable characteristics. For example, in certain memory cells programming may be achieved by forward biasing the memory cell (e.g., with reference to the polarity of a diode therewithin) with a voltage of approximately 6-8V, while erase may be achieved by reverse biasing the memory cell with a voltage of approximately 10-14V. These high voltages require use of special high voltage CMOS transistors within the word line and bit line decoders. These high-voltage transistors do not scale well as the memory cell word line and bit line pitch decreases. This is particularly problematic for 3D memory technology, in which the sheer density of word lines and bit lines exiting the array, and which must be interfaced with a word line and bit line driver, makes even more important the ability to provide decoder circuits, and particularly the word line and bit line driver circuits, compatible with ever smaller array line pitches, yet capable of impressing a sufficiently high voltage across a selected memory cell.

SUMMARY

In one aspect, the invention provides an integrated circuit that includes: a memory array of memory cells, each memory cell coupled between an associated array line of a first type and an associated array line of a second type; a first array line selection circuit comprising a first decoder circuit configured to generate a first plurality of decoded output nodes, each coupled to a respective multi-headed first-type array line driver circuit, and each multi-headed first-type array line driver circuit comprising a respective plurality of first array line driver circuits, each coupled to a respective array line of the first type; and a second array line selection circuit comprising a second decoder circuit configured to generate a second plurality of decoded output nodes, each coupled to a respective multi-headed second-type array line driver circuit, and each multi-headed second-type array line driver circuit comprising a respective plurality of second array line driver circuits, each coupled to a respective array line of the second type. The first decoder circuit maintains the same polarity in both a first mode of operation and a second mode of operation; the second decoder circuit maintains the same polarity in both the first mode of operation and the second mode of operation; the multi-headed first-type array line driver circuits have a reverse polarity in the second mode of operation than in the first mode of operation; the multi-headed second-type array line driver circuits have a reverse polarity in the second mode of operation than in the first mode of operation; and the first and second array line selection circuits impress across a selected memory cell, in the first mode of operation, a bias voltage of opposite polarity than that impressed in the second mode of operation.

In one aspect, the invention provides a method for decoding a memory array, which method includes: providing a first decoder circuit with an operating voltage of a first magnitude until all decoded outputs thereof are stable and a first voltage differential is established between a selected and unselected decoded outputs thereof, each decoded output being coupled to a respective plurality of array line driver circuits; and providing a first inactive voltage level on each bus line of a source select bus, said source select bus coupled to each of the respective pluralities of array line driver circuits, each respective array line driver circuit of a given plurality of array line driver circuits for coupling a respective bus line of the source select bus to a respective array line of a first type responsive to a decoded output of the first decoder circuit coupled to the given plurality of array line driver circuits; then increasing the operating voltage of the first decoder circuit to a second magnitude larger than the first magnitude, to thereby increase the differential voltage between selected and unselected decoded outputs to a second differential voltage greater than the first differential voltage; then pulsing a first bus line of the source select bus to a first active voltage level then back to the first inactive voltage level, to thereby pulse a first array line of the first type corresponding to the selected decoded output of the first decoder circuit; then decreasing the operating voltage of the first decoder to the first magnitude before allowing any decoded outputs thereof to change states.

The invention in several aspects is suitable for integrated circuits having a memory array, for methods for operating such integrated circuits and memory arrays, for methods of making memory products incorporating such arrays, all as described herein in greater detail and as set forth in the appended claims. The described techniques, structures, and methods may be used alone or in combination with one another.

The foregoing is a summary and thus contains, by necessity, simplifications, generalizations and omissions of detail. Consequently, those skilled in the art will appreciate that the foregoing summary is illustrative only and that it is not intended to be in any way limiting of the invention, which is defined by the appended claims. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 1 is a schematic diagram of a memory array, illustrating selected and unselected word lines and bit lines, and exemplary bias conditions in a forward bias mode of operation.

FIG. 2 is a schematic diagram of the memory array depicted in FIG. 1, but illustrating exemplary bias conditions in a reverse bias mode of operation.

FIG. 8 is a timing diagram of exemplary row decoder operation in a forward bias mode of operation.

FIG. 9 is a timing diagram of exemplary column decoder operation in a forward bias mode of operation.

FIG. 10 is a timing diagram of exemplary row decoder operation in a reverse bias mode of operation.

FIG. 11 is a timing diagram of exemplary column decoder operation in a reverse bias mode of operation.

FIG. 12 is a timing diagram of an exemplary transition of a row decoder to a reverse bias mode of operation.

FIG. 13 is a timing diagram of an exemplary transition of a column decoder to a reverse bias mode of operation.

The use of the same reference symbols in different drawings indicates similar or identical items.

DETAILED DESCRIPTION

Figure 3:
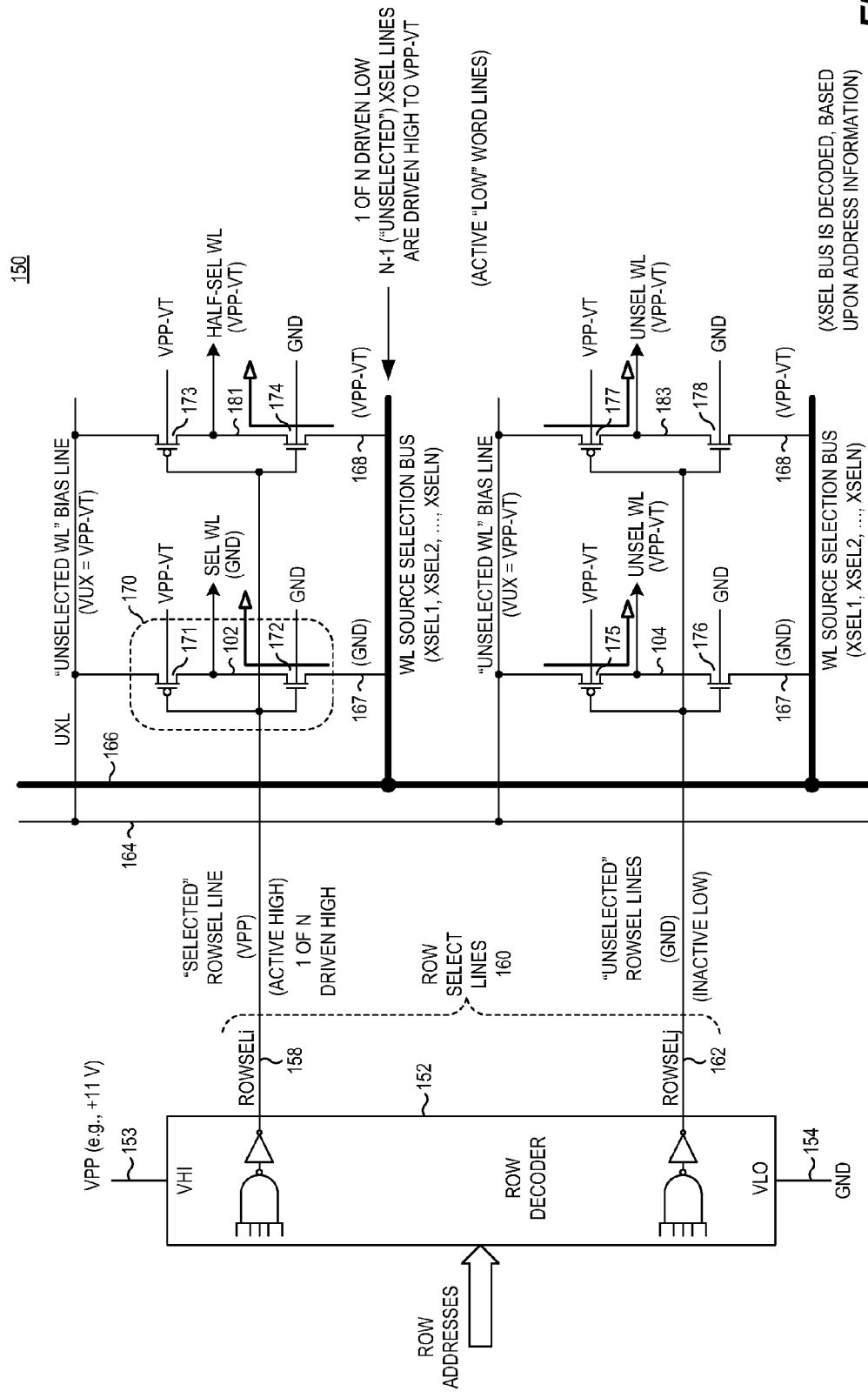
FIG. 3 is a schematic diagram of an exemplary row decoder and word line driver circuit, including exemplary conditions in a forward bias mode of operation.

FIG. 1 is a schematic diagram of an exemplary passive element memory array 100. Two word lines 102, 104 are shown, as well as two bit lines 106, 108. Word line 102 is assumed to be a selected word line (SWL), and word line 104 is assumed to be an unselected word line (UWL). Similarly, bit line 106 is assumed to be a selected bit line (SBL), and bit line 108 is assumed to be an unselected bit line (UBL). Four passive element memory cells 101, 103, 105, 107 are shown, each coupled between an associated word line and an associated bit line.

Memory cell 101 is associated with the selected word line 102 and the selected bit line 106, and may be viewed as an "S" cell (i.e., "selected" cell). Memory cell 103 is associated with the unselected word line 104 and the selected bit line 106, and may be viewed as an "F" cell (i.e., "off" cell). Memory cell 105 is associated with the selected word line 102 and the unselected bit line 108, and may be viewed as an "H" cell (i.e., "half-selected" cell). Lastly, memory cell 107 is associated with the unselected word line 104 and the unselected bit line 108, and may be viewed as a "U" cell (i.e., "unselected" cell).

Also illustrated in FIG. 1 are exemplary biasing conditions for a forward bias mode of operation. Such a forward bias mode may be used for a programming mode, an erase mode, a block erase mode, and/or a read mode (although usually with different voltage levels or conditions for such different modes). As shown, the bias conditions may be viewed as appropriate for a programming mode of operation for a selected array block, and will be described as such.

The selected word line 102 is biased at a VSX voltage (e.g., ground), the selected bit line 106 biased at a VSB voltage (e.g., +11 volts), the unselected word line 104 is biased at a VUX voltage (e.g., +10.3 volts), and the unselected bit line 108 biased at a VUB voltage (e.g., +0.7 volts). The selected bit line bias voltage VSB may be viewed as the programming voltage VPP, as substantially this entire voltage is impressed across the selected memory cell 101 (since the selected word line is biased at ground), less certain resistive drops in the busses and array lines themselves. The unselected bit line bias voltage VUB is also preferably set at a value corresponding to an apparent "threshold voltage" in a forward biased direction of each memory cell, and is thus shown as a voltage VT being impressed on the unselected bit line 108. Similarly, the unselected word line bias voltage VUX is also preferably set at a value of VPP−VT.

Under these biasing conditions, the S cell 101 receives a forward bias voltage equal to VPP (e.g., +11 volts), the F cell 103 receives a forward bias voltage equal to VT (e.g., +0.7 volts), the H cell 105 receives a forward bias voltage equal to VT (e.g., +0.7 volts), and the U cell 107 receives a reverse bias voltage equal to VPP−2VT (e.g., −9.6 volts). There are several exemplary memory cell technologies that, when biased under these conditions, the selected cell will be changed to a lower value of resistance, while the F, H, and U cells will not appreciably change in resistance. Exemplary cell technologies are described herebelow.

Referring now to FIG. 2, exemplary biasing conditions 200 are shown for a reverse bias mode of operation. Such a reverse bias mode may be used for a programming mode, an erase mode, and/or a block erase mode (although usually with different conditions for such different modes), one or more of which may be characterized as a second "write" mode of operation. As shown, the bias conditions may be viewed as appropriate for either a programming mode or erase mode of operation for a selected array block, and will be described as such.

Each of the bias conditions VSX, VUX, VSB, and VUB are now redefined for values appropriate for the present mode of operation. The selected word line 102 is biased at a VSX voltage of VWL (e.g., +6 volts), and the selected bit line 106 biased at a VSB voltage of −VBL (e.g., −6 volts). The unselected word line voltage VUX and the unselected bit line voltage VUB are both ground.

Under these biasing conditions, the S cell 101 receives a reverse bias voltage (sometimes referred to as VRR) equal in magnitude to VWL−(−VBL) (e.g., −12 volts), the F cell 103 receives a reverse bias voltage equal to VBL (e.g., −6 volts), and the H cell 105 receives a reverse bias voltage equal to VWL (e.g., −6 volts). Of note, the U cell 107 receives no bias across the cell.

There are several exemplary memory cell technologies (referenced below) that, when biased under these conditions, the selected cell will be changed from a lower value of resistance to a higher value of resistance, while the F, H, and U cells will not appreciably change in resistance. Also of interest are memory cell technologies that, when biased under these reverse mode conditions, the selected cell will be changed from a high resistance to a lower resistance. For example, a particular material of interest is a metal oxide memory device where some asymmetry in the metal oxide metal layered structure, such as electrode choices, produces a preferential field direction for set versus reset. Such materials may be used for a reverse bias set, as described more fully herebelow. It should also be noted that the unselected U memory cells, which otherwise may support a considerable amount of leakage current when biased with several volts across such a cell, have no bias and therefore no leakage current. As will be described in further detail, many useful memory array embodiments include a far larger number of U cells than H cells of F cells, and such arrays will have significantly less leakage current in the unselected memory cells of the array, and hence much less power dissipation, than with other biasing schemes.

By "splitting" the VRR voltage in this reverse mode, and biasing the SBL at a negative voltage equal to one half of the programming voltage (i.e., −VBL), and biasing the SWL at a positive voltage equal to one half of the programming voltage (i.e., VWL), the voltage requirements of both the bit line decoder and the word line decoder are significantly relaxed. Consequently, consistent with the small pitch of the array lines (e.g., word lines and bit lines), the high voltage transistors in the array line driver circuits take up less area because they may be designed for a relatively lower "split" voltage.

Other memory technologies have faced similar issues regarding the programming and erase voltages (and the area needed for such high-voltage transistors) not scaling at the same rate as the memory cell pitch. For example, the impact of this issue in FLASH memory is somewhat reduced because of the larger fan-out of typical FLASH-based memory arrays. The more space consuming design rules for high voltage transistors can be amortized in some newer technologies by increasing the memory block size. However, in a diode-based passive element memory array, larger block size comes at a cost of increased leakage through the unselected memory cells within the selected array. By biasing such unselected memory cells as described in FIG. 2, this leakage component can be reduced to almost zero, and a larger block sizes achieved with little deleterious power dissipation. Nevertheless, in certain embodiments, a reverse bias mode of operation may utilize entirely non-negative voltages (i.e., only positive voltages and ground) or only entirely non-positive voltages (i.e., only negative voltages and ground), or other combinations of positive and negative voltages.

Referring now to FIG. 3, an exemplary word line decoder circuit 150 is shown, including showing exemplary bias conditions suitable for a forward bias mode of operation (as described in FIG. 1). A row decoder circuit 152 is shown on the left side of the figure, which shows two decoded outputs 158, 162, which may also be referred to as row select (i.e., ROWSEL) outputs. The decoded output 158 corresponds to a selected decoded output, while the decoded output 162 corresponds to an unselected decoded output. The row decoder 152 may be implemented using any of a variety of well-known techniques. For example, such a decoder may be responsive to pre-decoded address signals generated by an earlier-stage row decode circuit (not shown), or may be responsive to address signals themselves. For the purposes of this description, the row decoder 152 may be viewed as including one or more circuit blocks which cooperate to decode row address information and generate decoded row select signals. Such a decoder circuit 152 may include a NAND gate responsive to pre-decoded address signals, followed by an inverting buffer to drive each row select node due to the large capacitive loading on each such row select node. The row decoder 152 is operated in this mode of operation with an upper supply voltage VHI equal to VPP coupled to power supply node 153 (also referred to herein as a "VDD node" or "VHI node" for the row decoder 152), and a lower supply voltage VLO of ground coupled to power supply node 154 (also referred to herein as a "VSS node" or "VLO node" for the row decoder 152). This row decoder 152 is an "active high" decoder, meaning that the selected output (or outputs), such as row select node 158, is driven to the higher of two available voltage states, which in this case is VPP. The unselected row select outputs, such as decoded output node 162, are driven to the lower of the two available voltage states, which in this case is ground. The description that follows will initially assume that only one such decoded output node is selected (e.g., "high") at a time.

Each decoded output is coupled to one or more word line driver circuits. For example, decoded output node 158 is coupled to a word line driver circuit 170 which includes PMOS transistor 171 and NMOS transistor 172. The respective drain terminal of transistors 171, 172 are both coupled to a word line, in this case representing the selected word line 102. While certain embodiments may contemplate decoders other than multi-headed decoders, FIG. 3 depicts a second word line driver circuit also coupled to the decoded output node 158, which represents one or more remaining word line driver circuits associated with this particular decoded output node 158. This second word line driver circuit includes PMOS transistor 173 and NMOS transistor 174, the output of which drives a word line 181 which collectively represents one or more half-selected word lines. Such half-selected word lines may reside in the same array block as the selected word line, and/or may even reside in other array blocks that are not selected.

The respective source terminal of the NMOS transistor in each of these word line driver circuits is coupled to a respective bus line of a WL source selection bus XSEL. In this mode of operation, the source selection bus is decoded, based upon address information, so that one such XSEL bus line is biased at an active state suitable for a word line for this mode of operation, while the remaining XSEL bus lines are biased at an inactive state suitable for word lines for this mode of operation. In certain embodiments, more than one such source selection bus line may be active, but we shall for now assume that the bus line 167 is active, and is biased at ground, while one or more remaining XSEL bus lines, collectively represented by XSEL bus line 168, are inactive and are driven to the unselected word line voltage VUX (shown as VPP−VT).

Since the voltage on decoded output node 158 (VPP) is higher than the voltage of bus lines 167, 168, both of the NMOS transistors 172, 174 are turned on, thus driving the selected word line 102 to ground, and driving the half selected word line 181 to VPP−VT. These two conduction paths are indicated by the open arrowhead lines.

The respective source terminal of the PMOS transistor in each of these word line driver circuits is coupled to an unselected WL bias line UXL, also labeled node 164. In this mode of operation, the UXL bias line 164 conveys the unselected word line voltage VUX. Since the voltage on decoded output node 158 (VPP) is higher than the voltage of the UXL bias line (VPP−VT), both PMOS transistors 171, 173 are turned off.

Turning now to the bottom of the figure, the decoded output node 162 is coupled to a word line driver circuit which includes PMOS transistor 175 and NMOS transistor 176. The respective drain terminal of transistors 175, 176 are both coupled to a word line, in this case representing the unselected word line 104. A second word line driver circuit also coupled to the decoded output node 162 represents one or more remaining word line driver circuits associated with the decoded output node 162, and includes PMOS transistor 177 and NMOS transistor 178, the output of which drives an unselected word line 183.

As before, the respective source terminal of the NMOS transistor in each of these word line driver circuits is coupled to a respective bus line of a WL source selection bus XSEL. Since the voltage on the unselected decoded output node 162 (ground) is at or lower than the voltage of XSEL bus lines 167, 168, both of the NMOS transistors 176, 178 are turned off. The respective source terminal of the PMOS transistor in each of these word line driver circuits is coupled to the unselected WL bias line UXL node 164. Since the voltage on unselected decoded output node 162 (ground) is lower than the voltage of the UXL bias line 164 (by more than the PMOS threshold voltage), both PMOS transistors 175, 177 are turned on, thus driving the unselected word lines 104, 183 to VUX (e.g., VPP−VT). These two conduction paths are indicated by the open arrowhead lines.

Figure 4:
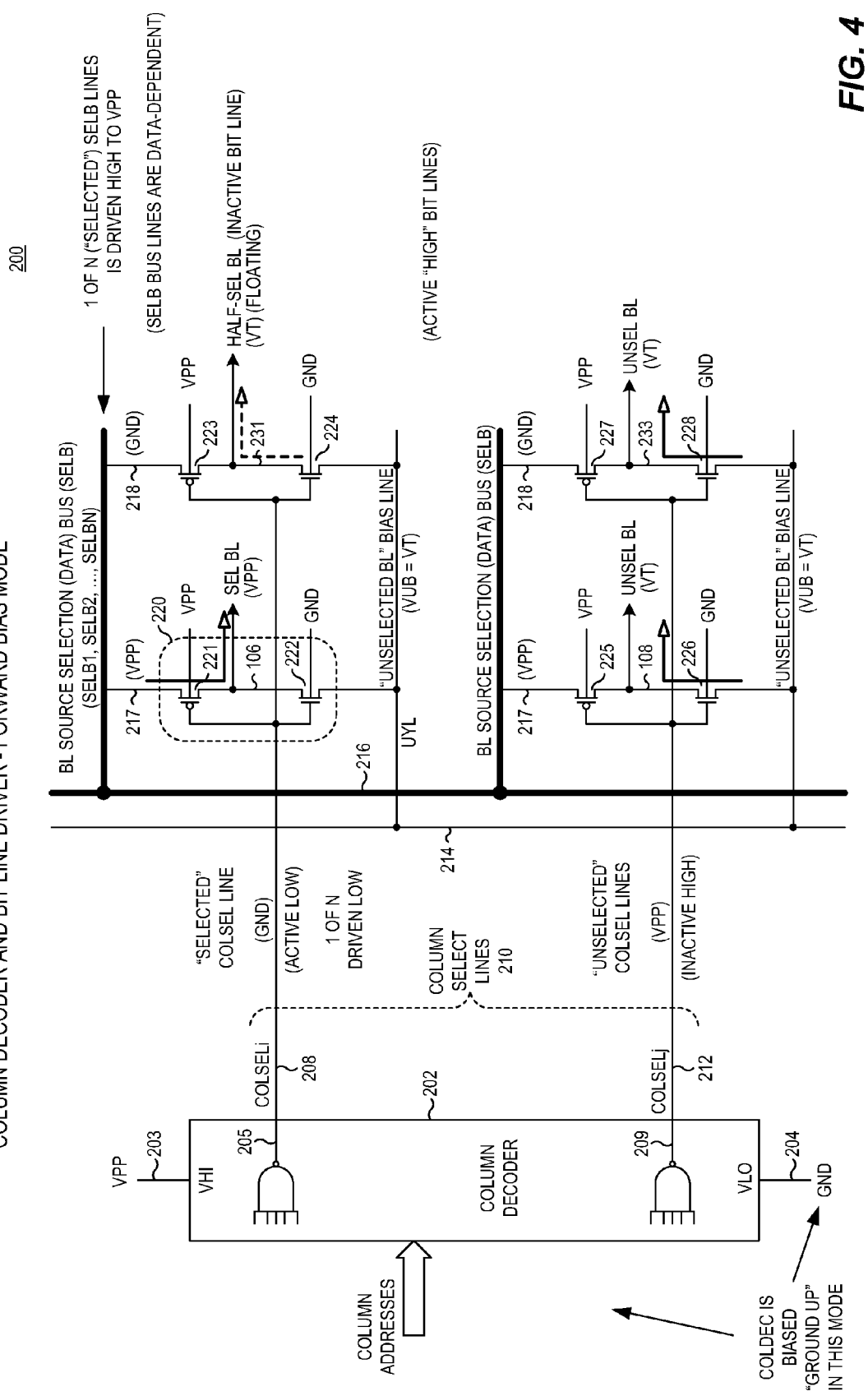
FIG. 4 is a schematic diagram of an exemplary column decoder and bit line driver circuit, including exemplary conditions in a forward bias mode of operation.

Referring now to FIG. 4, an exemplary bit line decoder circuit 200 is shown, including showing exemplary bias conditions suitable for a forward bias mode of operation (e.g., as described in FIG. 1). A column decoder circuit 202 is shown on the left side of the figure, which shows two decoded outputs 208, 212. The decoded output 208 corresponds to a selected decoded output, while the decoded output 212 corresponds to an unselected decoded output. The column decoder 202 may be implemented using any of a variety of well-known techniques, and generates a plurality of decoded outputs, such as outputs 205, 209, which are (for this particular embodiment) the same nodes as the column select nodes 208, 212. In the exemplary embodiment shown, and unlike the exemplary row decoder 152, there is no inverting buffer after the NAND gate to drive the decoded output nodes because the capacitive loading on node 208 (i.e., the COLSELi outputs) is much lower than for the row decoder (i.e., ROWSELi) outputs. The column decoder 202 is operated in this mode of operation with an upper supply voltage VHI equal to VPP coupled to power supply node 203, and a lower supply voltage VLO of ground coupled to power supply node 204. The column decoder 202 is an "active low" decoder. The unselected decoded outputs, such as decoded output node 212, are driven to the higher of the two available voltage states, which in this case is VPP. The description that follows will initially assume that only one such decoded output node 208 is selected (e.g., "low") at a time.

Each of the decoded outputs (i.e., COLSELi outputs) is coupled to one or more bit line driver circuits. For example, decoded output node 208 is coupled to a bit line driver circuit 220 which includes PMOS transistor 221 and NMOS transistor 222. The respective drain terminal of transistors 221, 222 are both coupled to a bit line, in this case representing the selected bit line 106. While certain embodiments may contemplate decoders other than multi-headed decoders, FIG. 4 depicts a second bit line driver circuit also coupled to the decoded output node 208, which represents one or more remaining bit line driver circuits associated with this particular column select node 208. This second bit line driver circuit includes PMOS transistor 223 and NMOS transistor 224, the output of which drives a bit line 231 which represents one or more half-selected bit lines. In contrast to the word line decoder, such a half selected bit line may represent a selected bit line which is being maintained in an inactive state, such as a bit line which, per the data to be programmed, does not require a programming bias be applied, or a bit line of a selected group of bit lines which may be waiting to be programmed while another bit line of the selected group is being programmed, both as further described below.

The respective source terminal of the PMOS transistor in each of these bit line driver circuits is coupled to a respective bus line of a BL source selection bus SELB. In this mode of operation, the source selection bus SELB is data dependent, and may further be decoded based upon address information, so that one or more such SELB bus lines are biased at an active state suitable for a bit line for this mode of operation, while the remaining SELB bus lines are biased at an inactive state suitable for bit lines for this mode of operation. In certain embodiments, more than one such source selection bus line may be active, but we shall for now assume that the bus line 217 is active, and is biased at VPP, while one or more remaining SELB bus lines, collectively represented by SELB bus line 218, are inactive and are driven to the ground. In certain embodiments, such inactive SELB bus lines 218 may be driven to the unselected bit line voltage VUB (in this mode of operation, VT) to actively couple such half-selected bit lines to the unselected bit line voltage VUB, as described more fully in U.S. application Ser. No. 11/461,352 filed Jul. 31, 2006 by Scheuerlein, et el., now U.S. Pat. No. 7,486,587, the disclosure of which is incorporated herein by reference.

Since the voltage on decoded output node 208 (ground) is lower than the voltage of bus line 217, the PMOS transistor 221 is turned on, thus driving the selected bit line 106 to VPP. This conduction path is indicated by the solid open arrowhead line. In contrast, the PMOS transistor 223 is turned off, since both its source and gate are biased at ground.

The respective source terminal of the NMOS transistor in each of these bit line driver circuits is coupled to an unselected BL bias line UYL, also labeled node 214. In this mode of operation, the UYL bias line conveys the unselected bit line voltage VUB (e.g., equal to VT). Since the voltage on decoded output node 208 (ground) is lower than the voltage of the UYL bias line 214, both NMOS transistors 222, 224 are turned off. However, since all bit lines are driven actively to this unselected bit line voltage VUB (e.g., equal to VT) when unselected (as described below), the half selected bit line 231 remains floating at approximately the VT voltage due to leakage through transistor 224. This conduction path is indicated by the dashed open arrowhead line.

The unselected decoded output node 212 is coupled to a bit line driver circuit which includes PMOS transistor 225 and NMOS transistor 226. The respective drain terminal of transistors 225, 226 are both coupled to a bit line, in this case representing the unselected bit line 108. A second bit line driver circuit also coupled to the decoded output node 212 represents one or more remaining bit line driver circuits associated with the decoded output node 212, and includes PMOS transistor 227 and NMOS transistor 228, the output of which drives an unselected bit line 233.

As before, the respective source terminal of the PMOS transistor in each of these bit line driver circuits is coupled to a respective bus line of a source selection bus SELB. Since the voltage on decoded output node 212 (VPP) is at or above the respective voltage of the bus lines 217, 218, both of the PMOS transistors 225, 227 are turned off. The respective source terminal of the NMOS transistor in each of these bit line driver circuits is coupled to the unselected BL bias line UYL node 214. Since the voltage on the unselected (i.e., inactive) decoded output node 212 is VPP, both NMOS transistors 226, 228 are turned on, thus driving the unselected bit lines 108, 233 to VUB (e.g., VT). These two conduction paths are indicated by the open arrowhead lines.

Figure 5:
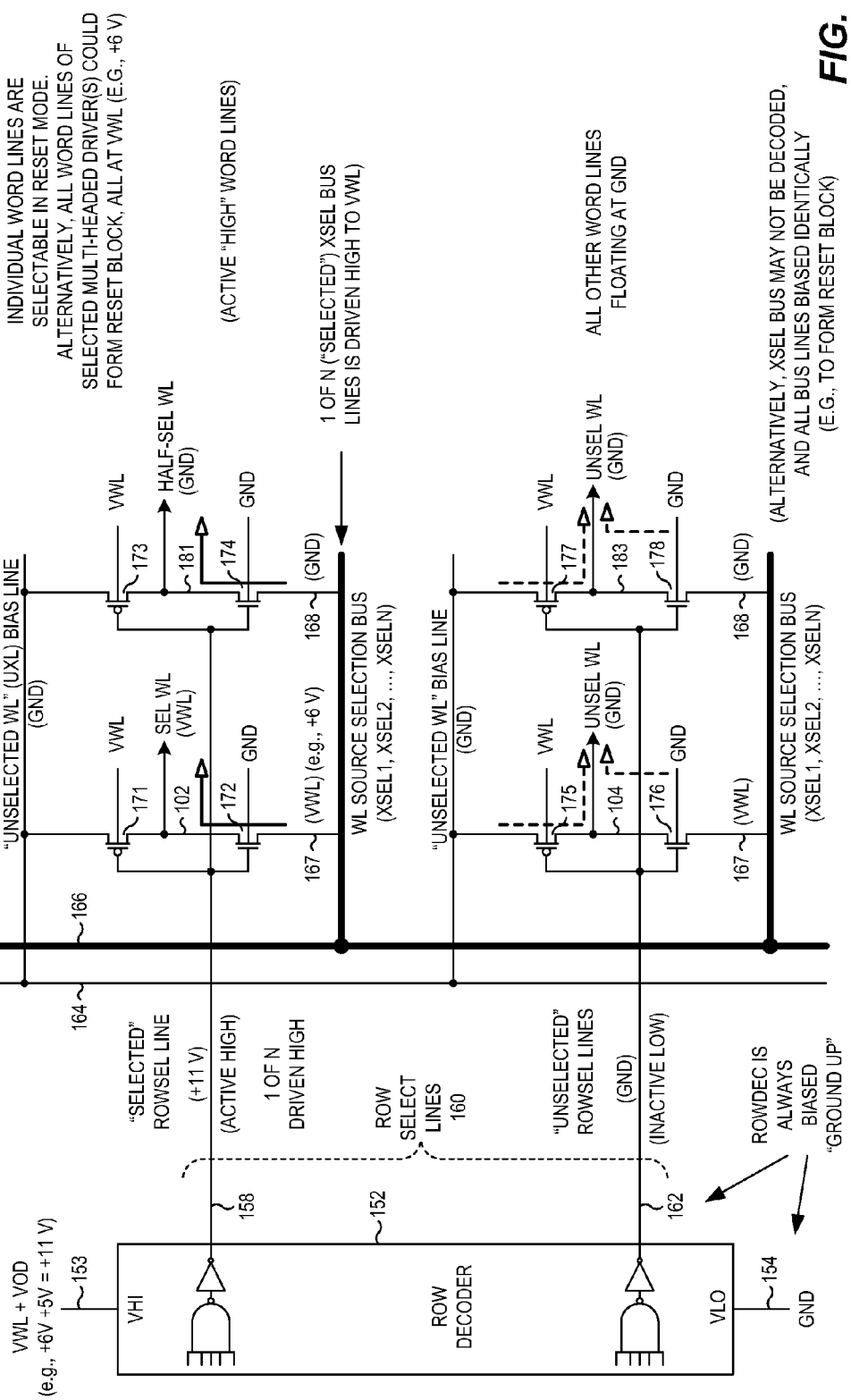
FIG. 5 is a schematic diagram of an exemplary row decoder and word line driver circuit, including exemplary conditions in a reverse bias mode of operation.

Exemplary bias conditions suitable for a reverse bias mode of operation will now be described. Referring now to FIG. 5, the exemplary word line decoder circuit 150 is shown including exemplary bias conditions suitable for a reverse bias mode of operation (e.g., as described in FIG. 2). The decoded output 158 of the row decoder 152 still corresponds to a selected decoded output, while the decoded output 162 corresponds to an unselected decoded output. The row decoder 152 is operated in this mode of operation, for example, with an upper supply voltage VHI equal to VWL+VOD (e.g., (+6V)+(+5V)=+11V) coupled to power supply node 153, and a lower supply voltage VLO of ground coupled to power supply node 154. The voltage VOD represents an "overdrive" voltage, as the description below makes clear. In this mode of operation, as with the forward bias case above, the row decoder 152 is an "active high" decoder, and the active (selected) decoded output 158 is driven to the higher of two available voltage states (e.g., +11V). The unselected decoded outputs, such as decoded output node 162, are driven to the lower of the two available voltage states (e.g., ground). In other words, the polarity of the row decoder is the same in both the forward and reverse modes of operation. In addition, the magnitude of the operating voltage (e.g., (VHI−VLO)=+11 volts) is the same in both the forward and reverse modes of operation, and the actual VHI and VLO supply voltages themselves are unchanged in the forward and reverse modes of operation.

In this reverse mode of operation, as before in the forward mode, the source selection bus XSEL is decoded, based upon address information, so that one such XSEL bus line is biased at active state suitable for a word line for this mode of operation, while the remaining XSEL bus lines are biased at an inactive state suitable for word lines for this mode of operation. In certain embodiments, more than one such source selection bus line may be active, but we shall for now assume that the XSEL bus line 167 is active, and is biased at VWL (e.g., +6V), while one or more remaining XSEL bus lines, collectively represented by XSEL bus line 168, are inactive and are driven to the unselected word line voltage VUX (e.g., ground).

Since the voltage on decoded output node 158 (e.g., +11V) is higher than the voltage of XSEL bus lines 167, 168, both of the NMOS transistors 172, 174 are turned on, thus driving the selected word line 102 to VWL (e.g., +6V), and driving the half selected word line 181 to ground. These two conduction paths are indicated by the open arrowhead lines. It should be noted that the NMOS transistors are biased to pull up a selected word line, rather than pull down such a selected word line.

The respective source terminal of the PMOS transistor in each of these word line driver circuits is coupled to the unselected WL bias line UXL, node 164. In this mode of operation, the UXL bias line conveys the unselected word line voltage VUX, which is, for example, ground (although other voltages may also be used). Since the voltage on decoded output node 158 (e.g., +11V) is higher than the voltage of the UXL bias line (e.g., ground), both PMOS transistors 171, 173 are turned off.

Turning now to the bottom of the figure, since the voltage on the unselected decoded output node 162 (e.g., ground) is at or below the voltage of XSEL bus lines 167, 168, both of the NMOS transistors 176, 178 are turned off. Similarly, since the voltage on unselected decoded output node 162 (e.g., ground) is also the same as the voltage of the UXL bias line 164, both PMOS transistors 175, 177 are also turned off, thus leaving the unselected word lines 104, 183 in a floating condition. Leakage currents in these unselected word line drivers (i.e., drain-to-source leakage through transistors 175, 177, and 178, and word line to substrate leakage in transistors 176, 178) serves to keep the unselected word lines at ground (i.e., "floating at ground"). In the exemplary circuit shown, the NMOS pull-down transistors 176, 178 are larger than the PMOS pull-up transistors 175, 177. This larger transistor has a greater amount of leakage to its substrate well (e.g., tied to GND) than does the smaller transistor. Consequently, the leakage current to ground dominates over the substrate leakage current to VWL resulting from the PMOS transistors 175, 177, and this net current tends to maintain the unselected word lines 104, 183 at or near the ground potential.

Other voltage values may be used for the upper supply voltage VHI as long as sufficient overdrive voltage VOD is provided, and for the lower supply voltage VLO. For example, the lower supply voltage VLO may be a negative voltage (i.e., a voltage that is below the unselected word line voltage VUX by at least a PMOS threshold voltage) so that the PMOS transistors 175, 177 would turn on and drive the unselected word lines to ground. In such an embodiment, the large number of unselected row select lines 162 would be driven to the VLO voltage rather than ground. Such an embodiment showing VLO=−1V is disclosed in the aforementioned U.S. Pat. No. 7,486,587, the disclosure of which is incorporated herein by reference.

In some embodiments, individual word lines may be selected in either the forward or reverse bias mode of operation by "selecting" only one of the XSEL bus lines 167, 168 (i.e., decoding and driving one such bus line to the selected word line voltage appropriate for the given mode of operation, and maintaining the remaining bus lines at the unselected word line voltage appropriate for the given mode of operation). In some embodiments, more than one word line may be simultaneously selected by selecting more than one XSEL bus line associated with a multi-headed word line driver circuit, such as might be useful for a reset block in which a contiguous block of word lines are driven to a selected voltage, such as VWL (e.g., +6V).

Figure 6:
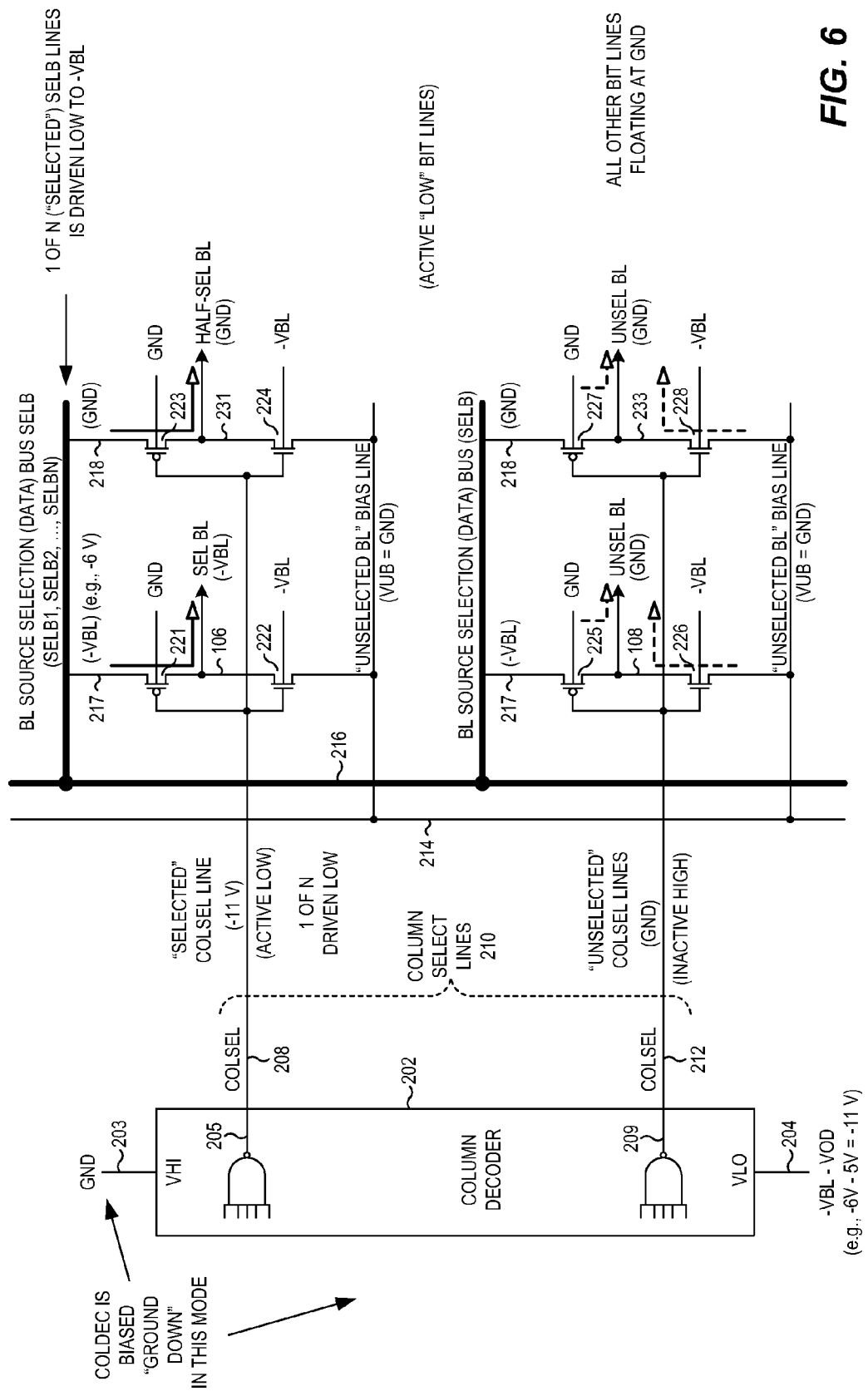
FIG. 6 is a schematic diagram of an exemplary column decoder and bit line driver circuit, including exemplary conditions in a reverse bias mode of operation.

Referring now to FIG. 6, the exemplary bit line decoder circuit 200 is shown including bias conditions suitable for a reverse bias mode of operation (e.g., as described in FIG. 2). The decoded output 208 of the column decoder 202 still corresponds to a selected decoded output, while the decoded output 212 corresponds to an unselected decoded output. The column decoder 202 is operated in this mode of operation in a "ground down" mode of operation, for example, with an upper supply voltage VHI equal to GND coupled to power supply node 203, and a lower supply voltage VLO of −VBL−VOD (e.g., (−6V)−(+5V)=−11V) coupled to power supply node 204. The voltage VOD again represents an "overdrive" voltage, as the description below makes clear. In this mode of operation, as with the forward bias case above, the column decoder remains an "active low" decoder, and the active (selected) decoded output 208 is driven to the lower of two available voltage states (e.g., −11V). The unselected decoded outputs, such as decoded output node 212, are driven to the higher of the two available voltage states (e.g., ground). In other words, the polarity of the column decoder 202 is the same in both the forward e.g., "ground up") and reverse (e.g., "ground down") modes of operation.

In this mode of operation, as in the forward mode, the source selection bus SELB is data dependent, and may further be decoded based upon address information, so that one or more such bus lines are biased at an active state suitable for a bit line for this mode of operation, while the remaining bus lines are biased at an inactive state suitable for bit lines for this mode of operation. In certain embodiments, more than one such source selection bus line may be active, but we shall for now assume that the SELB bus line 217 is active, and is biased at −VBL (e.g., −6V), while one or more remaining SELB bus lines, represented by SELB bus line 218, are inactive and are driven to ground.

Since the voltage on decoded output node 208 (e.g., −11V) is lower than the voltage of bus line 217, the PMOS transistor 221 is turned on, thus driving the selected bit line 106 to −VBL. This conduction path is indicated by the solid open arrowhead line. It should be noted that the PMOS transistor 221 is biased to pull down a selected bit line, rather than pull up such a selected bit line (relative to the unselected voltage). In addition, the PMOS transistor 223 is also turned on, thus driving the half-selected bit line 231 to GND. In this mode of operation, the UYL bias line 214 conveys the unselected bit line voltage VUB (e.g., GND). Since the voltage on decoded output node 208 is lower than the voltage of the UYL bias line, both NMOS transistors 222, 224 are turned off.

Regarding the unselected column decoder output nodes, since the voltage on decoded output node 212 (GND) is at or above the respective voltage of the SELB bus lines 217, 218, both of the PMOS transistors 225, 227 are turned off. In addition, both NMOS transistors 226, 228 are also turned off, thus leaving the unselected bit lines 108, 233 in a floating condition. Leakage currents in these unselected bit line drivers (i.e., drain-to-source leakage through transistors 226, 227, 228, and bit line to substrate leakage in transistors 225, 227) serves to keep the unselected bit lines at ground. In the exemplary circuit shown, the PMOS transistors 225, 227 are larger than the NMOS transistors 226, 228. The larger PMOS transistor has a greater amount of leakage to its substrate well (which is tied to GND) than does the smaller NMOS transistor. Consequently, since the larger transistor 225 has a substrate tied to ground, the substrate leakage current to ground dominates over the substrate leakage current to −VBL resulting from the NMOS transistor 226, and this net current tends to maintain the unselected bit lines 108, 233 at or near the ground potential.

Other voltage values may be used for the lower supply voltage VLO as long as sufficient overdrive voltage VOD is provided, and for the upper supply voltage VHI. For example, the upper supply voltage VHI may be a small positive voltage (i.e., a voltage that is above the unselected bit line bias voltage VUB by at least an NMOS threshold voltage) so that the NMOS transistors 226, 228 would turn on and drive the unselected bit lines to ground. In such an embodiment, the large number of unselected column select lines 212 would be driven to the VHI voltage rather than ground. Such an embodiment showing VHI=+1V is disclosed in the aforementioned U.S. Pat. No. 7,486,587.

In this embodiment, it should be noted that, in the forward mode, the column decoder is active low and the bit lines are active high. In the reverse mode, the column decoder maintains its polarity (although shifting its voltages downward), but the bit lines themselves reverse polarity and become active low. Conversely, in the forward mode, the row decoder is active high and the word lines are active low. In the reverse mode, the row decoder maintains its polarity, but the word lines themselves reverse polarity and become active high. It should also be noted that the column decoder output levels shift in average voltage between the "ground-up" forward mode (i.e., GND to VPP) and the "ground-down" reverse mode (i.e., −VBL−VOD to GND).

When viewed as a non-multi-headed decoder (in FIGS. 3, 4, 5, and 6, only a single array line driver circuit per decoded output), the operation of the decoder circuit may be described very simply. In the reverse mode, the word line decoder reverses its polarity and brings one selected word line high (∼6V) and keeps all others at ground. The converse happens on the bit line selection side, where one bit line is selected and brought to −6V and all others are grounded. The end result is 12V of reverse bias across the selected memory cell and zero volts across all others. The transistors in the word line and bit line driver circuits only have to withstand 6V, or half the maximum voltage, rather than the entire voltage.

In certain materials incorporated by reference herein, such as the aforementioned U.S. Pat. No. 7,486,587, the reverse mode of operation is described as imposing a VRR potential across a selected memory cell, with the selected word line being driven to +VRR/2, and the selected bit line being driven to −VRR/2. In the descriptions herein, reverse mode of operation is described similarly, but using the notations of driving the selected word line to +VWL (which corresponds to +VRR/2) and driving the selected bit lines to −VBL (which corresponds to −VRR/2). This +VWL and −VBL notation removes any suggestion that the positive selected word line voltage must have the same magnitude as the negative selected bit line voltage.

When one considers the implications of using multi-headed decoders (as shown in FIGS. 3, 4, 5, and 6), it should be noted that the circuits thus far described utilize a decoded source selection bus in the forward direction, which allows a single one of the group of array lines (i.e., word lines, bit lines) to be selected, while the remaining half-selected array lines are driven to (or near) an unselected bias condition. In the reverse mode, half-selected array lines are actively driven to their respective inactive voltages by powering the row and column decoders by "over-voltages," so that the decoded output nodes traverse higher than the NMOS source voltages in the word line driver circuits, and lower than the PMOS source voltages in the bit line driver circuits. By so doing, the selected word line may be driven up to the +VWL voltage through the NMOS transistor, and the selected bit line may be driven down to the −VBL voltage through the PMOS transistor. This utilizes the same transistors to drive the selected word line and bit line in both the forward mode and the reverse mode. For example, NMOS transistor 172 drives the selected word line in both the forward and reverse modes, rather than PMOS transistor 171, which allows transistor 171 to be much smaller since it need not support a programming or erase current. Similarly, PMOS transistor 221 drives the selected bit line in both the forward and reverse modes, rather than NMOS transistor 222, which allows transistor 222 to be much smaller since it need not support a programming or erase current. In addition, a second set of source select busses (i.e., so called reverse source selection busses) are not required, and the layout area that such busses would have required may be avoided.

Figure 7:
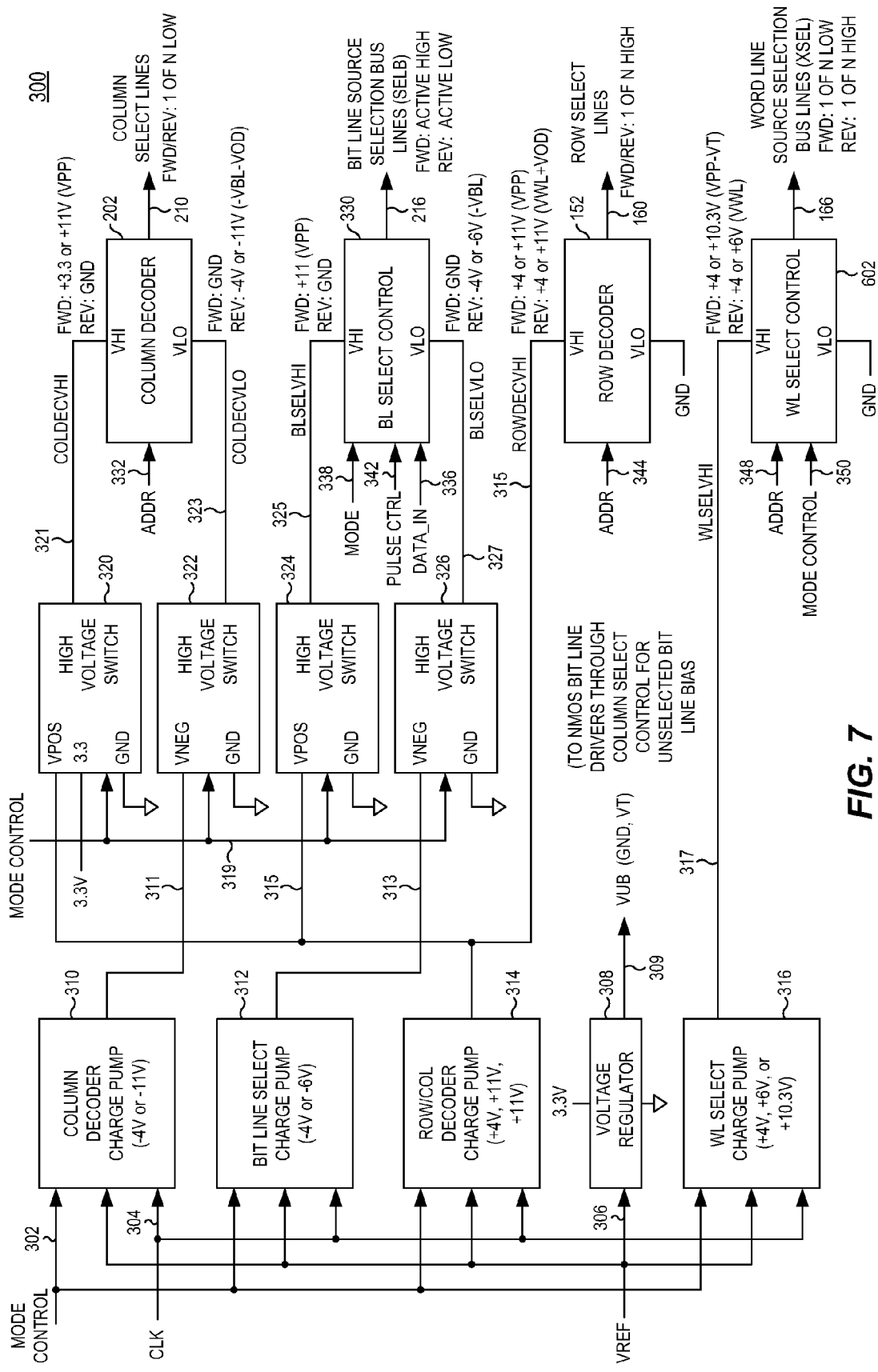
FIG. 7 is a block diagram of exemplary high voltage generator circuits and switch circuits for row and column decoders, and for bias circuits for word line and bit line driver circuits.

FIG. 7 is a block diagram of an exemplary arrangement 300 for high voltage generator circuits and high voltage switch circuits for row and column decoders, and for bias circuits for word line and bit line driver circuits. This figure illustrates the use of several different high voltage generator circuits (e.g., charge pump circuits), each of which generates a different voltage in different modes of operation. These voltages are coupled to the various decoder circuits, as described below.

Four charge pump circuits 310, 312, 314, 316 generate four respective output voltages on respective output nodes 311, 313, 315, 317, responsive to mode control signal 302, a reference voltage VREF on node 306, and a clock signal 304. The COL DEC charge pump 310 selectively generates a −4V or −11V output voltage on its output node 311. The BL SELECT charge pump 312 selectively generates a −4V or −6V output voltage on its output node 313. The ROW/COL DEC charge pump 314 selectively generates either a +4V or +11V output voltage on its output node 315. Lastly, the WL SELECT charge pump 316 selectively generates either a +4V, +6V, or +10.3V output voltage on its output node 317. The mode control signal 302 communicates to each charge pump circuit which voltage to generate, which depends upon the choice of forward or reverse mode of operation, and also a timing sequence within a given mode of operation, as described in greater detail below. Exemplary charge pump circuits are described in U.S. Pat. No. 7,495,500 to Ali K. Al-Shamma and Roy E. Scheuerlein entitled "Method for Using a Multiple Polarity Charge Pump Circuit," the disclosure of which is incorporated by reference herein in its entirety.

High voltage switch circuits 320, 322 select the appropriate VHI and VLO voltages for the column decoder 202, and high voltage switch circuits 324, 326 select the appropriate VHI and VLO voltages for the bit line select control 330, each in response to the mode control 319 signal(s). Switch circuit 320 couples to its output node 321 either a positive voltage received on node 315 (e.g., +11V), a 3.3V voltage, or a 0V voltage (i.e., ground). Switch circuit 322 couples to its output node 323 either a negative voltage received on node 311, or a ground voltage. Switch circuit 324 couples to its output node 325 either a positive voltage received on node 315, or a ground voltage. Lastly, switch circuit 326 couples to its output node 327 either a negative voltage received on node 313, or a ground voltage. (Switch circuit 326 may utilize a VT input for an embodiment in which the unselected SELB bus lines are driven to VT rather than ground, as is described in regards to FIG. 4.)

The column decoder 202 receives address information 332 and decodes its column select lines 210 so that a selected column select line is driven to the COLDECVLO voltage conveyed on node 323 which is coupled to its VLO input, and so that unselected column select lines are driven to the COLDECVHI voltage conveyed on node 321 which is coupled to its VHI input. A selected column select line corresponds to COLSEL 208, and unselected column select lines correspond to COLSEL 212, both as shown in FIGS. 4, 6. In the forward mode of operation, the COLDECVHI voltage sequences between +3.3V and +11V (as described below) in response to the dual-voltage sequence generated by charge pump 314, and the COLDECVLO voltage is ground. In the reverse mode of operation, the COLDECVHI voltage is ground, and the COLDECVLO voltage sequences between −4V and −11V (as described below) in response to the dual-voltage sequence generated by charge pump 310. As noted in the earlier figures, the column select lines 210 are "1-of-N active low" select lines for both the forward and reverse mode of operation. Consequently, there is no required reconfiguration of the internal circuitry within column decoder 202 to switch between the forward and reverse modes of operation. Instead, the column decoder 202 operation is changed from a "ground-up" operation in the forward mode to a "ground-down" operation in the reverse mode by changing its VHI and VLO voltages.

The bit line select control circuit 330 receives data state information on DATA_IN bus 336 and drives the bit line source selection SELB bus lines 216. In the forward mode of operation, the SELB bus 216 is a "1-(or-more)-of-N active high" bus. Thus, one or more selected SELB bus lines are driven to the BLSELVHI voltage conveyed on node 325 which is coupled to the VHI input, and unselected SELB bus lines are driven to the BLSELVLO voltage conveyed on node 327 which is coupled to the VLO input. A selected SELB bus line, for example, is labeled 217 in FIGS. 4, 6, and unselected SELB bus lines are represented by the bus line labeled 218 in FIGS. 4, 6. In the forward mode of operation, the BLSELVHI voltage is +11V, and the BLSELVLO voltage is ground. In the reverse mode of operation, the SELB bus 216 is a "1-(or more)-of-N active low" bus. Thus, one or more selected SELB bus lines are driven to the BLSELVLO voltage, and unselected SELB bus lines are driven to the BLSELVHI voltage. The BLSELVHI voltage is ground, and the BLSELVLO voltage sequences between −4V and −6V (as described below) in response to the dual-voltage sequence generated by the charge pump 312. The bit line select control circuit 330 responds to a mode control 338 signal to achieve this polarity reversal.

The exemplary bit line select control circuit 330 may also receive a timing pulse control signal 342 to cause one or more "active" SELB lines (i.e., both a selected SELB bus line, and having the appropriate data state to write/erase the memory cell) to be driven to the appropriate voltage (−VBL in the reverse mode, or VPP in the forward mode) for the desired length of time, as described in greater detail below. A number of DATA_IN 336 bus lines (e.g., from 1 to N) are driven to an active state as determined by the desired data state and control logic (not shown) to control associated bit line source selection bus lines (SELB) to the corresponding active state (e.g., high during forward modes, and low during reverse modes) during a forward or reverse programming operation. In some embodiments, SELB bus line switching (e.g., SELB Bus Switching 408 shown in FIG. 9; SELB Bus Switching 488 shown in FIG. 11) occurs during times when a fixed high voltage (e.g., BLSELVHI=VPP) is applied to the BL Select Control 330 circuitry, and is controlled by changing the data states on DATA_IN bus lines 336. Since the BL Select Control 330 need not be implemented on the array line pitch, and is relatively few in number compared to the decoders and driver circuits, less dense circuits than used in decoders and drivers can be used. Any of several known circuits such as higher voltage transistors, longer channel length transistors, and series devices to avoid snap back, may be used in the BL Select Control 330 circuitry to safely switch voltages up to VPP.

The row decoder 152 receives address information 344 and decodes its row select lines 160 so that a selected row select line is driven to the ROWDECVHI voltage conveyed on node 315 which is coupled to its VHI input, and unselected row select lines are driven to the ROWDECVLO voltage coupled to its VLO input, which is ground. A selected row select line corresponds to ROWSEL 158, and unselected row select lines correspond to ROWSEL 162, both as shown in FIGS. 3, 5. As noted in the earlier figures, the row select lines 160 are "1-of-N active high" select lines for both the forward and reverse mode of operation. In both modes of operation, the ROWDECVHI voltage sequences between +4V and +11V (as described below) in response to the dual-voltage sequence generated by charge pump 314, and the ROWDECVLO voltage is ground.

The word line select control circuit 602 receives address information 348 and decodes the word line source selection XSEL bus lines 166. In the forward mode of operation, the XSEL bus 166 is a "1-of-N active low" bus. Thus, a selected XSEL bus line is driven to the WLSELVLO voltage (i.e., ground), and unselected XSEL bus lines are driven to the WLSELVHI voltage, which sequences between +4V and +10.3V (as described below) in response to the dual-voltage sequence generated by charge pump 316. A selected XSEL bus line, for example, is labeled 167 in FIGS. 3, 5, and unselected XSEL bus lines are represented by the bus line labeled 168 in FIGS. 3, 5. In the reverse mode of operation, the XSEL bus 166 is a "1-of-N active high" bus. Thus, a selected XSEL bus line is driven to the BLSELVHI voltage, and unselected XSEL bus lines are driven to the BLSELVLO voltage, i.e., ground. The word line select control circuit 602 responds to a mode control 350 signal to achieve this polarity reversal.

Address information 332, 344, 348 may each represent actual address signals (e.g., true and complement address signals for each address bit). Such address information 332, 344, 348 may each represent pre-decoded address information generated by an upstream decoder or pre-decoder circuit, as is well known in the art.

FIG. 8 is a timing diagram of exemplary row circuits operation in a forward bias mode of operation. During ROW POWER-UP interval 362, the row circuits transition from a standby state to a powered up state. Preferably the row address inputs are all inactive to inhibit "selecting" any of the row select lines 160 and XSEL bus lines 166. The ROW/COL DEC charge pump 314 is enabled to generate a +4V output voltage, and the WL SELECT charge pump 316 is likewise enabled to generate a +4V output voltage. In response, all row select lines 160 are unselected and driven to ground, all XSEL bus lines 166 are unselected and driven to +4V, and all word lines are unselected and driven to +4V.

During ROW DEC SWITCH interval 364, the address inputs associated with the row decoder circuitry are enabled to present a desired row address. The row select lines and the XSEL bus lines switch, if necessary, in response to this row address, and ultimately stabilize to decode the row select line and XSEL bus line associated with the row address. At such time, the selected row select line 158 is driven to +4V, the unselected row select lines 162 are driven to ground (or remain at ground), the selected XSEL bus line 167 is driven to ground, and the unselected XSEL bus lines 168 are driven to +4V (or remain at +4V). Thus, the selected word line 102 is driven to ground, and the unselected word lines are driven to +4V (or to +4−VT) by the word line driver circuits (such as that labeled 170 in FIG. 3).

During ROW HV ON interval 366, the ROW/COL DEC charge pump 314 is enabled to increase its generated output voltage to +11V (VPP), and the WL SELECT charge pump 316 is enabled to increase its generated output voltage to +10.3V (VPP−VT). The address inputs are inhibited from changing state. As a result, the selected row select line 158 follows the increasing ROWDECVHI voltage to +11V, and the unselected XSEL bus lines 168 follow the increasing WLSELVHI voltage to +10.3. The unselected row select lines 162 remain at ground, and the selected XSEL bus line 167 likewise remains at ground.

During interval 368, all decoded nodes in the row circuits remain in a stable state, with various nodes biased at suitable voltages for the forward mode of operation. Neither the row select lines 160 nor the XSEL bus lines 166 are allowed to switch. The selected row select line 158 is biased at VPP (e.g., +11V), and the unselected row select lines 162 are biased at ground. The selected XSEL bus line 167 is biased at ground, and the unselected XSEL bus lines 168 are biased at VPP−VT (e.g., +10.3V). Such exemplary bias conditions are consistent with those shown in FIG. 1 and FIG. 3. During this interval 368, the column circuits are preferably powered up, then sequentially select different memory cells for writing, and are then powered down, as is described below.

During ROW HV OFF interval 370, the ROW/COL DEC charge pump 314 output voltage is decreased back to +4V, and the WL SELECT charge pump 316 output voltage is decreased back to +4V. The address inputs are still inhibited from changing state. As a result, the selected row select line 158 follows the decreasing ROWDECVHI voltage back down to +4V, and the unselected XSEL bus lines 168 follow the decreasing WLSELVHI voltage back down to +4V. The unselected row select lines 162 remain at ground, and the selected XSEL bus line 167 likewise remains at ground.

During ROW DEC SWITCH interval 372, a new row address is presented, and the row select lines and the XSEL bus lines switch, if necessary, in response to this row address, and ultimately stabilize to decode the row select line and XSEL bus line associated with the new row address. As was the case at the end of the earlier interval 364, the selected row select line 158 is driven to +4V, the unselected row select lines 162 are driven to ground, the selected XSEL bus line 167 is driven to ground, and the unselected XSEL bus lines 168 are driven to +4V. Thus, the newly selected word line 102 is driven to ground, and the unselected word lines are driven to +4V (or to +4−VT) by the word line driver circuits.

During the intervals 374, 376, and 378 the row circuits operate in the same manner as with corresponding intervals 366, 368, 370. Each time a new row address is to be presented during this mode of operation, the row high voltages are first turned off (i.e., ROW HV OFF interval 370), the row address is allowed to switch (i.e., ROW DEC SWITCH interval 372), and then the row high voltages are turned back on (i.e., ROW HV ON interval 374). When finished with all row addresses to be programmed, the row circuits may be powered down, as shown in ROW POWER DOWN interval 380, during which time the ROW/COL DEC charge pump 314 and WL SELECT charge pump 316 are both disabled or turned off so that their respective output voltages return to ground.

FIG. 9 is a timing diagram of exemplary column circuits operation in a forward bias mode of operation. The entire sequence of operation is preferably carried out during a stable high voltage row interval, such as interval 368 (as shown in FIG. 8) or corresponding interval 376.

During COLUMN POWER-UP interval 402, the column circuits transition from a standby state to a powered up state. Preferably the column address inputs are all inactive to inhibit "selecting" any of the column select lines 210 and SELB bus lines 216. The voltage regulator 308 is enabled to generate a +VT output voltage (e.g., 0.7V) on node 309, which is conveyed to the unselected BL bias line 214 (e.g., see FIG. 4). High voltage switch 320 couples its 3.3V input to the COLDECVHI voltage, and high voltage switch 322 couples its GND input to the COLDECVLO voltage, so that all column select lines 210 are unselected and driven to 3.3V. High voltage switch 324 couples its VPOS input to the BLSELVHI voltage, and high voltage switch 326 couples its GND input to the BLSELVLO voltage. The PULSE CTRL signal 342 to the BL SELECT CONTROL circuit 330 overrides the DATA_IN Bus lines 336, and all SELB bus lines 216 are inactive and biased at ground. Since all column select lines 210 are unselected and biased at 3.3V, and the unselected bit line bias line 214 is biased at VT, all the bit lines are unselected and driven to VT.

During COL DEC SWITCH interval 404, the address inputs associated with the column decoder circuitry are enabled to present a desired column address 332. The column select lines 210 will switch, if necessary, in response to this column address, and ultimately stabilize to decode the column select line associated with the column address. Consequently, the selected column select line 208 is driven to ground, and the unselected column select lines 212 are driven to +3.3V. All the SELB bus lines 216 remain inactive at ground, and all the bit lines are unselected and held at VT by the bit line driver circuits.

During COL HV ON interval 406, the high voltage switch 320 selects its VPOS input to convey the VPP voltage to the COLDECVHI voltage (recall that the ROW/COL DEC charge pump 314 was previously enabled to generate an output voltage of +11V (VPP), and remains so during interval 368). The high voltage switch 324 also selects its VPOS input to convey the VPP voltage to the BLSELVHI voltage. The column address inputs are preferably inhibited from changing state. As a result, the selected column select line 208 remains at ground, but the large number of unselected column select lines 212 follow the increasing COLDECVHI voltage to +11V. All the SELB bus lines 216 remain inactive at GND, and all the bit lines are unselected and held at VT.

During SELB SWITCHING interval 408, the column select lines 210 do not change, so that the selected column select line 208 is biased at ground, and the unselected column select lines 212 are biased at VPP (e.g., +11V). However, in response to the MODE control 338, the PULSE CTRL signal 342, and the DATA_IN Bus lines 336, the SELB bus lines 216 are now sequentially driven to the active voltage VPP in accordance with data state to be programmed, then returned to the inactive GND voltage. As a result, a selected bit line 106 to be programmed is pulsed (i.e., driven for a time) to VPP, then returned to the unselected bit line bias voltage VT. A selected bit line which, because of the data state, need not be programmed, remains at VT. Such exemplary bias conditions are consistent with those shown in FIG. 1 and FIG. 4.

During COL HV OFF interval 410, the high voltage switch 320 again selects its 3.3V input to switch the COLDECVHI voltage back to +3.3V. The address inputs are inhibited from changing state. The MODE control signal 338 and PULSE CTRL signal 342 together ensure that all SELB bus lines are inactive and held at ground, even though the BLSELVHI voltage may still be coupled to the VPP voltage, and irrespective of the DATA_IN bus line 336. As a result, the selected column select line 208 remains at ground, and the unselected column select lines 212 follow the decreasing COLDECVHI voltage back down to +3.3V. All bit lines remain unselected at the VT voltage.

During COL DEC SWITCH interval 412, a new column address is presented, and the column select lines switch in response to this column address, and ultimately stabilize to decode the column select line associated with the new column address. As was the case at the end of the earlier interval 404, the selected column select line 208 is driven to ground, and the unselected column select lines 212 are driven to +3.3V. All the SELB bus lines 216 remain inactive at ground, and all the bit lines are unselected and held at VT by the bit line driver circuits.

During the intervals 414, 416, and 418 the column circuits operate in the same manner as with corresponding intervals 406, 408, 410. Each time a new "column select" address is to be presented during this mode of operation (i.e., an address which corresponds to a different column select line 210 being selected), the column high voltages are first turned off (i.e., COL HV OFF interval 410), the column select address is allowed to switch (i.e., COL DEC SWITCH interval 412), and then the column high voltages are turned back on (i.e., COL HV ON interval 414).

When finished with all column addresses, the column circuits may be powered down, as shown in COL POWER DOWN interval 420, during which time the high voltage switch 320 selects its GND input, so that its COLDECVHI output voltage on node 321 returns to ground. The voltage regulator 308 may also be disabled so that its output returns to ground.

FIG. 10 is a timing diagram of exemplary row circuits operation in a reverse bias mode of operation. During ROW POWER-UP interval 442, the row circuits transition from a standby state to a powered up state. Preferably the row address inputs are all inactive to inhibit "selecting" any of the row select lines 160 and XSEL bus lines 166. The ROW/COL DEC charge pump 314 is enabled to generate a +4V output voltage, and the WL SELECT charge pump 316 is likewise enabled to generate a +4V output voltage. In response, all row select lines 160 are unselected and driven to ground, all XSEL bus lines 166 are unselected and driven to ground, the unselected WL bias line 164 is biased at ground, and all word lines are unselected and driven to a voltage no higher than a PMOS threshold voltage above ground. As described earlier, the unselected word lines float at or near ground due to drain-to-source leakage in PMOS driver transistors, and substrate leakage in NMOS driver transistors, as well as leakage through unselected memory cells.

During ROW DEC SWITCH interval 444, the address inputs associated with the row decoder circuitry are enabled to present a desired row address. The row select lines and the XSEL bus lines switch, if necessary, in response to this row address, and ultimately stabilize to decode the row select line and XSEL bus line associated with the row address. At such time, the selected row select line 158 is driven to +4V, the unselected row select lines 162 are driven to ground (or remain at ground), the selected XSEL bus line 167 is driven to +4V, and the unselected XSEL bus lines 168 are driven to ground (or remain at ground). Thus, the selected word line 102 is driven to +4V, and the unselected word lines are driven to ground (for half selected word lines) or driven to a voltage no higher than +VTP (for unselected word lines) by the word line driver circuits (and subsequently leak toward ground).

During ROW HV ON interval 446, the ROW/COL DEC charge pump 314 is enabled to increase its generated output voltage to +11V (VWL+VOD), and the WL SELECT charge pump 316 is enabled to increase its generated output voltage to +6V (VWL). The address inputs are inhibited from changing state. As a result, the selected row select line 158 follows the increasing ROWDECVHI voltage to +11V, and the selected XSEL bus line 167 follows the increasing WLSELVHI voltage to +6V. The unselected row select lines 162 remain at ground, and the unselected XSEL bus lines 168 likewise remain at ground.

During interval 448, all decoded nodes in the row circuits remain in a stable state, with various nodes biased at suitable voltages for the reverse mode of operation. Neither the row select lines 160 nor the XSEL bus lines 166 are allowed to switch. The selected row select line 158 is biased at VPP (e.g., +11V), and the unselected row select lines 162 are biased at ground. The selected XSEL bus line 167 is biased at VWL (+6V), and the unselected XSEL bus lines 168 are biased at ground. Such exemplary bias conditions are consistent with those shown in FIG. 2 and FIG. 5. During this interval 448, the column circuits are preferably powered up, then sequentially select different memory cells for writing, and are then powered down, as is described below.

During ROW HV OFF interval 450, the ROW/COL DEC charge pump 314 output voltage is decreased back to +4V, and the WL SELECT charge pump 316 output voltage is decreased back to +4V. The address inputs are still inhibited from changing state. As a result, the selected row select line 158 follows the decreasing ROWDECVHI voltage back down to +4V, and the selected XSEL bus line 167 follows the decreasing WLSELVHI voltage back down to +4V. The unselected row select lines 162 remain at ground, and the unselected XSEL bus lines 168 likewise remain at ground.

During ROW DEC SWITCH interval 452, a new row address is presented, and the row select lines and the XSEL bus lines switch, if necessary, in response to this row address, and ultimately stabilize to decode the row select line and XSEL bus line associated with the new row address. As was the case at the end of the earlier interval 444, the selected row select line 158 is driven to +4V, the unselected row select lines 162 are driven to ground, the selected XSEL bus line 167 is driven to +4V, and the unselected XSEL bus lines 168 are driven to ground. Thus, the newly selected word line 102 is driven to +4V, and the unselected word lines are driven to ground (for half selected word lines) or driven to a voltage no higher than +VTP (for unselected word lines) by the word line driver circuits (and subsequently leak toward, and are biased at, ground).

During the intervals 454, 456, and 458 the row circuits operate in the same manner as with corresponding intervals 446, 448, 450. Each time a new row address is to be presented during this mode of operation, the row high voltages are first turned off (i.e., ROW HV OFF interval 450), the row address is allowed to switch (i.e., ROW DEC SWITCH interval 452), and then the row high voltages are turned back on (i.e., ROW HV ON interval 454). When finished with all row addresses to be programmed, the row circuits may be powered down, as shown in ROW POWER DOWN interval 460, during which time the ROW/COL DEC charge pump 314 and WL SELECT charge pump 316 are both disabled or turned off so that their respective output voltages return to ground.

FIG. 11 is a timing diagram of exemplary column circuits operation in a reverse bias mode of operation. The entire sequence of operation is preferably carried out during a stable high voltage row interval, such as interval 448 (as shown in FIG. 10) or corresponding interval 456.

During COLUMN POWER-UP interval 482, the column circuits transition from a standby state to a powered up state. Preferably the column address inputs are all inactive to inhibit "selecting" any of the column select lines 210 and SELB bus lines 216. In certain embodiments the control inputs to Column decoder 202 and BL Select Control 330 are provided by level shifting circuitry which provides ground-up or ground-down signals, respectively, for forward mode or reverse mode operations. The voltage regulator 308 is enabled to generate a GND output voltage on node 309, which is conveyed to the unselected BL bias line 214 (e.g., see FIG. 6). The COLUMN DECODER charge pump 310 is enabled to generate a −4V output voltage. High voltage switch 320 couples its GND input to the COLDECVHI voltage, and high voltage switch 322 couples its VNEG input to the COLDECVLO voltage, so that all column select lines 210 are unselected and driven to GND.

The BL SELECT charge pump 312 is likewise enabled to generate a −4V output voltage. High voltage switch 324 couples its GND input to the BLSELVHI voltage, and high voltage switch 326 couples its VNEG input to the BLSELVLO voltage. The PULSE CTRL signal 342 to the BL SELECT CONTROL circuit 330 overrides the DATA_IN bus line 336, and all SELB bus lines 216 are inactive and biased at ground. Since all column select lines 210 are unselected and biased at GND, and the unselected bit line bias line 214 is biased at GND, all the bit lines are unselected and are driven to a voltage that is within a VT of ground (i.e., no lower than an NMOS threshold voltage below ground, and no higher than a PMOS threshold above ground). Leakage currents within the bit line driver circuits will tend to urge each unselected bit line to ground.

During COL DEC SWITCH interval 484, the address inputs associated with the column decoder circuitry are enabled (if not already so) to present a desired column address. The column select lines 210 will switch, if necessary, in response to this column address, and ultimately stabilize to decode the column select line associated with the column address. Consequently, the selected column select line 208 is driven to the COLDECVLO voltage, which is currently −4V, and the unselected column select lines 212 are driven to the COLDECVHI voltage, which is currently GND. All the SELB bus lines 216 remain inactive at ground, and the bit lines are either half-selected and held at GND by the bit line driver circuits which are responsive to the selected COLSEL line 208, or are unselected and remain at or near ground by conduction and/or leakage currents in the bit line driver circuits which are responsive to the unselected COLSEL lines 212.

During COL HV ON interval 486, the COL DEC charge pump 310 is enabled to increase the magnitude of its generated output voltage to −11V (−VBL−VOD), and the BL SELECT charge pump 312 is enabled to increase the magnitude of its generated output voltage to −6V (i.e., −VBL). As a result, the COLDECVLO voltage is driven to −11V, and the BLSELVLO voltage is driven to −6V. The column address inputs are preferably inhibited from changing state. As a result, the selected column select line 208 follows the COLDECVLO voltage to −11V, but the large number of unselected column select lines 212 remain at GND. All the SELB bus lines 216 remain inactive at GND, and the bit lines are either half-selected and held at GND by the bit line driver circuits which are responsive to the selected COLSEL line 208, or are unselected and remain at or near ground by conduction and/or leakage currents in the bit line driver circuits which are responsive to the unselected COLSEL lines 212.

During SELB SWITCHING interval 488, the column select lines 210 do not change, so that the selected column select line 208 is biased at −VBL−VOD (e.g., −11V), and the unselected column select lines 212 are biased at GND. However, in response to the MODE control 338, the PULSE CTRL signal 342, and the DATA_IN bus lines 336, the SELB bus lines 216 are now sequentially driven to the active voltage −VBL (e.g., −6V) in accordance with the data state to be programmed, then returned to the inactive GND voltage. As a result, a selected bit line 106 to be programmed is pulsed (i.e., driven for a time) to −VBL, then returned to the unselected bit line bias voltage GND. A selected bit line which, because of the data state, need not be programmed, remains at GND. Such exemplary bias conditions are consistent with those shown in FIG. 2 and FIG. 6.

During COL HV OFF interval 490, the address inputs are inhibited from changing state. The MODE control signal 338 and PULSE CTRL signal 342 together ensure that all SELB bus lines are inactive and held at ground, irrespective of the DATA_IN bus line 336. The COL DEC charge pump 310 is enabled to decrease the magnitude of its generated output voltage to −4V, and the BL SELECT charge pump 312 is enabled to decrease the magnitude of its generated output voltage to −4V. As a result, the COLDECVLO voltage is driven to −4V, and the BLSELVLO voltage is driven to −4V. As a result, the selected column select line 208 follows the COLDECVLO voltage to −4V, and the unselected column select lines 212 remain at GND. All bit lines remain at (or near) GND by the bit line driver circuits, as described above.

During COL DEC SWITCH interval 492, a new column address is presented, and the column select lines switch in response to this column address, and ultimately stabilize to decode the column select line associated with the new column address. As was the case at the end of the earlier interval 484, the selected column select line 208 is driven to −4V, and the unselected column select lines 212 are driven to GND. All the SELB bus lines 216 remain inactive at ground, and all the bit lines are unselected and held at or near GND by the bit line driver circuits.

During the intervals 494, 496, and 498 the column circuits operate in the same manner as with corresponding intervals 486, 488, 490. Each time a new "column select" address is to be presented during this mode of operation (i.e., an address which corresponds to a different column select line 210 being selected), the column high voltages are first turned off (i.e., COL HV OFF interval 490), the column select address is allowed to switch (i.e., COL DEC SWITCH interval 492), and then the column high voltages are turned back on (i.e., COL HV ON interval 494). Switching the column decoder 202 only when powered at a lower voltage (e.g., 4V operating voltage), and not when powered at the higher voltage (e.g., 11V operating voltage), improves the voltage margin of the column decoder. However, if the voltage margins allow for higher voltage switching of the column decoder 202, the power otherwise required to discharge and charge all the unselected COLSEL lines (e.g., from −11V to −4V and back) every time a column address is changed may be saved.

When finished with all column addresses, the column circuits may be powered down, as shown in COL POWER DOWN interval 500, during which time the high voltage switch 322 may select its GND input, so that its COLDECVLO output voltage on node 323 returns to ground. Alternatively, the high voltage switch 322 may remain unchanged, and the COLUMN DEC charge pump 310 may be disabled to cause its output to return to GND, so that the COLDECVLO output voltage on node 323 returns to ground.

In addition, the high voltage switch 326 may select its GND input, so that its BLSELVLO output voltage on node 327 returns to ground. Alternatively, the high voltage switch 326 may remain unchanged, and the BL SEL charge pump 312 may be disabled to cause its output to return to GND, so that the BLSELVLO output voltage on node 327 returns to ground.

As may be seen from the above description, the row circuits use the same control sequence in the forward bias mode of operation as in the reverse bias mode of operation. The row source selection busses do not switch when at a high voltage, but only are allowed to switch when powered at a lower voltage. The polarity of the row decoder is unchanged between the forward and reverse modes (e.g., active high), and the operating voltage is also unchanged (e.g., +11V). However, the source selection bus XSEL control logic activates 1-of-N active low in forward mode (and changes to activate 1-of-N active high in reverse mode). Consequently, the word lines are active low in the forward biased mode, and active high in the reverse mode.

As may be seen from the above description, the column decoder outputs (i.e., COLSEL lines 210) only switch at a low voltage of about 4V, so there is no danger of snapback. The column source selection bus (i.e., SELB) switches at a higher voltage (e.g., 11V in forward mode, 6V in reverse mode), and the SELB control circuits preferably use stacked devices and known D-S voltage limiting techniques to avoid snapback. The source selection bus SELB control logic 330 provides the appropriate data state for one or more simultaneously selected bit lines (e.g., active high in the forward mode, and active low in the reverse mode).

It is noted that this figure shows the SELB lines switching at high voltage to program all the "waiting" bit lines. In some embodiments all bit lines for a given column address may be programmed in the same pulse time, so there are no waiting bit lines, and only one SELB pulse is required (i.e., all SELB bus lines that are pulsed in accordance with the corresponding data to be written are pulsed at the same time).

The above description of the timing diagrams depicted in FIGS. 8-11 provide a useful backdrop to better understand several subtleties and useful arrangements when transitioning between the forward mode and the reverse mode.

FIG. 12 is a timing diagram of an exemplary transition of the row decoder circuits to a reverse bias mode of operation. During interval 522, all row decoder outputs (i.e., row select lines 160) are deselected and are driven to ground. As a result, all word lines are unselected and driven to the VUX voltage (e.g., +4V during this interval) conveyed on the UXL bias line 164. Then, during interval 524, the UXL bias line 164 is discharged to ground. With all row decoder outputs deselected (i.e., at ground), and the UXL bias line 164 at ground, the PMOS transistor in each word line driver circuit discharges each word line down to the PMOS threshold voltage (i.e., VTP), at which point the PMOS transistors cut off. Leakage current through the U memory cells (see FIG. 2) and within the unselected word line driver circuits (see FIG. 5) will continue to discharge the word lines toward ground. Thus, all word lines are discharged to VTP, and leak to ground through the U cells and the well junctions (as described above). The unselected word lines remain floating near ground during the reverse bias operation.

The remaining intervals 442, 444, 446, 448, 450, and 460 are identical to those described in FIG. 10, and need not be described again here. In all modes of operation and also in standby, the unselected outputs of the row decoder 152 (i.e., the unselected ROWSELj lines 162) are at ground. The unselected WL (UXL) bias line 164 is discharged to ground in standby, as shown in time interval 524.

FIG. 13 is a timing diagram of an exemplary transition of the column decoder circuitry to a reverse bias mode of operation. During interval 542, the "unselected bit line bias" UBL line 214 is also brought from its usual VUB bias level (e.g., VT) to ground. This discharges all the unselected bit lines through the NMOS transistors 226, 228 in each bit line driver circuit that are connected to the unselected bit line bias line 214. During interval 544, all remaining column decoder outputs (i.e., column select lines 210) are deselected and are driven high. As a result, during interval 546 all remaining bit lines are unselected and driven to the VUB voltage, which at this time is now GND. In this manner, all bit lines are discharged to ground before beginning a reverse bias mode of operation. Although this description is for a "word line first" timing (i.e. the bit line pulse is within a pre-established word line bias), the opposite is also comprehended where the SELB voltages and bit line voltages for all the bit lines in a given column are established at their desired bias before the selected word line is pulsed. In this case, the row sequence of intervals 444, 446, 448, 450 occur within a single column high voltage interval 488. If the same data is to be programmed into more than one row (e.g., writing a background pattern into a memory array) for a given column, the row sequence of intervals 444, 446, 448, 450, 452, 454, 456, 458 may occur within a single column high voltage interval 488.

Next, during interval 548, the VHI and VLO of the column decoder 202 are both ramped downward to the "ground down" configuration (i.e., operating with the upper supply voltage equal to GND, and a negative lower supply voltage). Specifically, the VHI of the column decoder 202, and the VHI of the source select bus SELB control circuit, are ramped from V33 to ground. The VLO of the column decoder 202, and of the source select bus SELB control circuit, are ramped from GND to a negative low voltage of, for this example, around −4V.

During interval 550, the column decoder 202 is enabled to decode and drive a selected COLSEL line 208 to the VLO voltage (e.g., −4V), with unselected COLSELj lines 212 remaining at GND. The next three intervals 486, 488, and 490 are identical to those described in FIG. 11, and need not be described again here.

At the end of reverse bias mode of operation, the column decoder is disabled so that all COLSEL lines 210 are unselected during interval 552. Then, during interval 544, the VHI and VLO of the column decoder circuitry are both ramped upward to the "ground up" configuration. The VHI of the column decoder 202, and the VHI of the source select bus SELB control circuit, are ramped from ground up to V33, and the VLO of the column decoder 202, and of the source select bus SELB control circuit, are ramped from a negative low voltage up to ground.

The exemplary decoder circuits described above advantageously make use of only a single decoded source selection bus. Moreover, in the array line drivers for both the word lines and the bit lines, the same device provides programming current in both the forward and reverse modes of operation. As a result, only one device within the array line driver circuits needs to be sized large enough to carry the programming current, thereby providing for smaller array line driver circuits.

The exemplary decoder circuits described above are useful for implementing memory arrays in which the memory cells include a reversible resistor plus a diode. Such memory cells may be reset using a reverse bias applied across the cell, and providing for half-selected word lines and bit lines allows individual word lines and bit lines to be placed in a reset bias condition, thus providing the capability to reset individual memory cells without having to reset an entire block.

The forward mode was described above in the context of a programming condition, in which the voltage applied to the selected bit line is VPP. The forward mode is also applicable for a read mode in which the selected bit line is driven to a read voltage VRD, and the selected word line again is driven to ground. Such a read voltage may be a much lower voltage than the programming voltage VPP, and the unselected word line bias voltage VUX and the unselected bit line bias voltage VUB accordingly reduced over their values for the programming mode. In some embodiments, such a read mode may be the only forward mode, and the reverse mode used for programming the memory.

Certain memory cells may be "programmed" using a forward bias mode, and block erased using the reverse mode. Other cells may be pre-conditioned (such as during manufacture) using an initial forward bias programming technique, but then are "programmed" using the reverse mode, and "erased" using the forward mode. To avoid confusion with historical usage in the programmable arts, and to comprehend different memory technologies that are contemplated for use with the decoder circuits thus far described, three different modes of operation are useful to describe: read, set, and reset. In the read mode, a read voltage VRD is applied across a selected memory cell. In the set mode, a set voltage VPP is applied across a selected memory cell. In the exemplary embodiments thus far described, the read voltage VRD and the set voltage VPP are both positive voltages, and such modes are carried out using the forward mode of decoder operation. In the reset mode, a reset voltage VRR is applied across a selected memory cell. In the exemplary embodiments thus far described, the reset voltage VRR is applied as a reverse bias voltage, and is carried out using the reverse mode of decoder operation. As indicated above, reverse set and forward reset operation is also contemplated, while preconditioning and read mode is still a forward bias operation. The preconditioning may be two steps: a forward bias step to achieve an intermediate resistance state, followed by a reverse set operation.

The reset mode described above uses a split voltage technique to limit the voltage requirements for the decoder circuits, and drives a selected bit line to a negative voltage (i.e., using a triple well semiconductor structure).

Many types of memory cells (described below) are capable of being programmed using the reset mode. In certain of these memory cell technologies, an antifuse within each memory cell is initially popped in the forward direction. Then the resistance of each memory cell is "tuned" in the reverse bias direction to accomplish programming. This would be the case for a one-time-programmable cell. For re-writable cells, the cell is erased using the forward direction, which could be performed in a block of various sizes, and then programmed using the reverse mode.

The reverse bias may be used to reset the selected memory cell. The programming current is supplied by a diode breakdown. In addition, the bias conditions associated with such programming may be carefully controlled, including controlling the voltage ramp of the selected word line and/or bit line. Additional insight into useful programming techniques maybe found in U.S. Pat. No. 6,952,030 referenced below. Multiple programming operations may be used to program various resistance states, as described in the 023-0049 and 023-0055 applications, referenced below, and as described in more detail in the MA-163-1 application, referenced below. The use of sloped programming pulses is described in the SAND-01114US0 and SAND-01114US1 applications, referenced below, and techniques for trimming the resistance of multiple cells is described in the SAND-01117US0 and SAND-01117US1 applications, referenced below.

The use of the reset programming as described above for programming a passive element memory cell incorporating a trimmable resistive element is particularly useful in providing great flexibility to allow for a larger array block size. Even in a selected array block (as all the descriptions above have assumed), there is no bias across the unselected memory cells in the reset mode, and therefore no wasted power dissipation. The reverse current through a cell (Irev) is not a concern for block size. Therefore many blocks may be selected to increase the write bandwidth. In addition, the voltage across each half selected memory cell is only one half of the programming voltage, and is safe for these cells.

It should be noted that in the descriptions above, the reset mode describes selected and half-selected word lines and bit lines. In the context of row selection, for example, such a half-selected word line may in fact be "not selected" by a given address, and such term is an artifact of the multi-headed word line driver structure. However, in the context of the bit lines, such a half-selected bit line may in fact be selected as far as the column address is concerned, but may be biased to an inactive state rather than the active state for the bit lines, either because the particular data for that bit line does not require "programming" the cell, or because the bit line is "waiting" to be programmed. This occurs when fewer than the number of bit line decoder heads are programmed at the same time. Of note, however, programming bandwidth concerns suggest configuring a memory array to simultaneously program as many bit lines as possible.

Triple well processing allows the selected bit line(s) to be taken to a negative voltage while the selected word line(s) is taken to a positive voltage. In the reset programming (i.e., reverse mode), the reference level for all unselected array lines (bit lines and word lines) is ground, which allows for rapid decoding and selection of both word lines and bit lines. Referring back to the description of the unselected word lines and bit lines being floating at ground (due to the leakage current to the well potential of the larger of the two driver transistors), the resistive nature of the memory cells provides an additional leakage current between such unselected array lines and the half-selected array lines, which are actively held at the unselected bias level. This further encourages the unselected array lines to remain floating at or near the unselected bias potential.

Two-dimensional memory arrays are contemplated, but the decoder arrangements are believed particularly useful for a 3D memory array having multiple memory planes. In certain preferred embodiments, the memory array is configured with each word line comprising word line segments on each of more than one word line layer, as described below.

In some contemplated embodiments, the operation of the row and column circuitry may be interchanged so that the row decoder is operated "ground-up" in one mode, and operated "ground-down" in another mode of operation. In such embodiments, the selected bit line may be driven to non-negative voltages in both modes of operation, and the selected word line may be driven to a positive voltage in one mode and driven to a negative voltage in another mode of operation.

Figure 14:
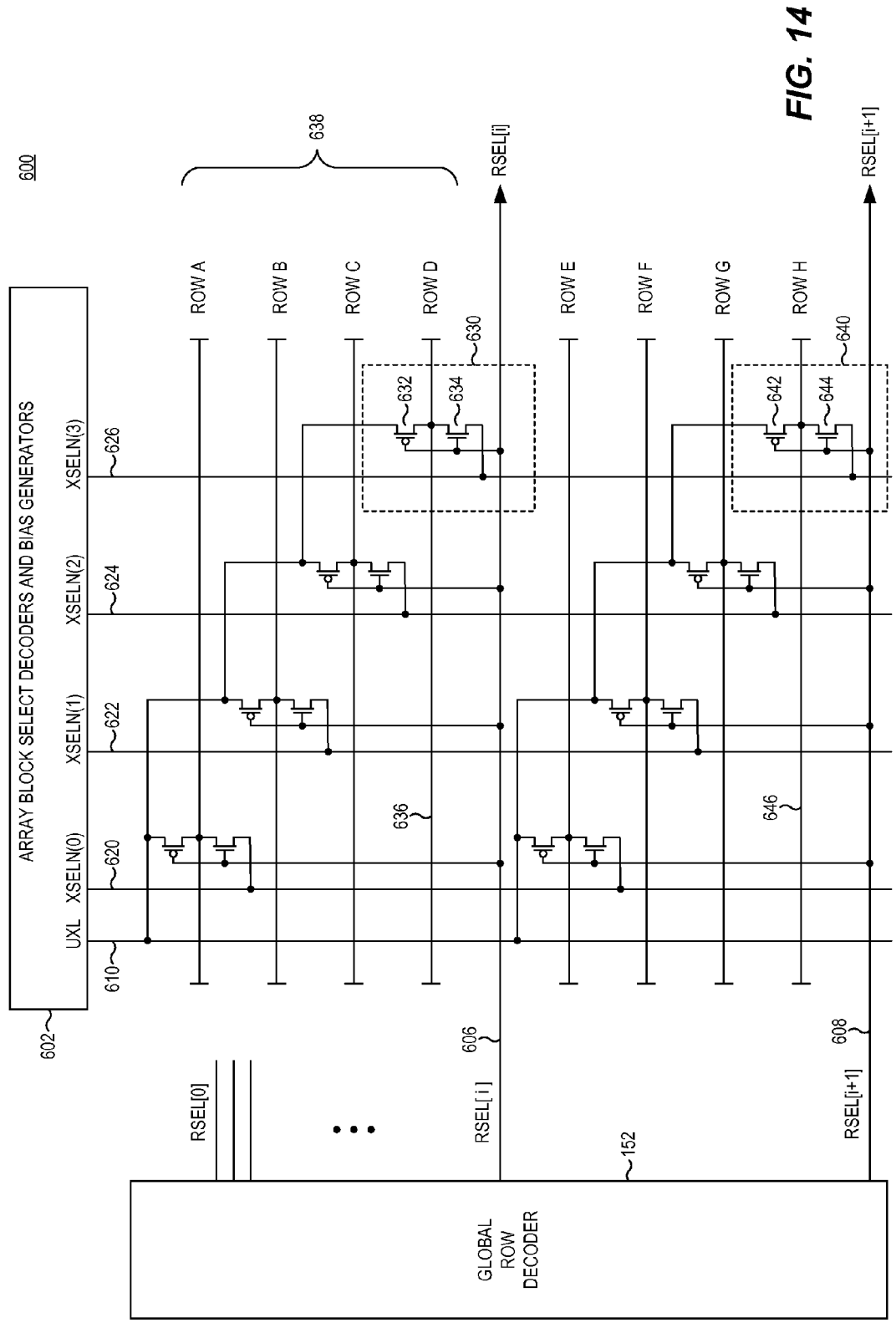
FIG. 14 is a block/schematic diagram depicting a global row decoder arrangement with multi-headed word line drivers, each coupled to an unselected bias line, and to respective lines of a source selection bus.

Referring now to FIG. 14, a block diagram is depicted of a useful multi-headed word line decoder configuration 600. The UXL bias line and XSELN lines traverse perpendicular to the word line segments, and the RSEL row select lines traverse parallel to the word line segments. A row decoder 152 generates a plurality of decoded RSEL lines, two of which are labeled 606 and 608. Such RSEL lines may also be described herein as "ROWSEL" lines. An array block select decoders and bias generators circuit 602 generates four decoded source selection bus lines XSELN(0), XSELN(1), XSELN(2), XSELN(3), respectively labeled 620, 622, 624, and 626, and also generates the UXL bias line 610. Such XSELN bus lines may also be described herein as XSEL bus lines.

A quad (i.e., four-headed) word line driver circuit 638 includes four separate word line driver circuits 630, each coupling a respective word line (e.g., word line 636) to either an associated XSELN bus line (e.g., in a set mode when the RSEL 606 is selected) or to the UXL bias line 610 (in a set mode when the RSEL 606 is unselected). As described above, one selected XSELN may convey a selected bias level, and the other XSELN lines convey an unselected bias level, in the set mode of operation.

Similarly, a second quad word line driver circuit is shown which includes four separate word line driver circuits 640, each coupling a respective word line (e.g., word line 646) to either an associated XSELN line or to the UXL bias line 610. Similar array block organizations are disclosed, particularly in relation to FIG. 9 thereof, in U.S. Pat. No. 6,879,505 to Roy E. Scheuerlein, the disclosure of which is hereby incorporated by reference in its entirety.

Figure 15:
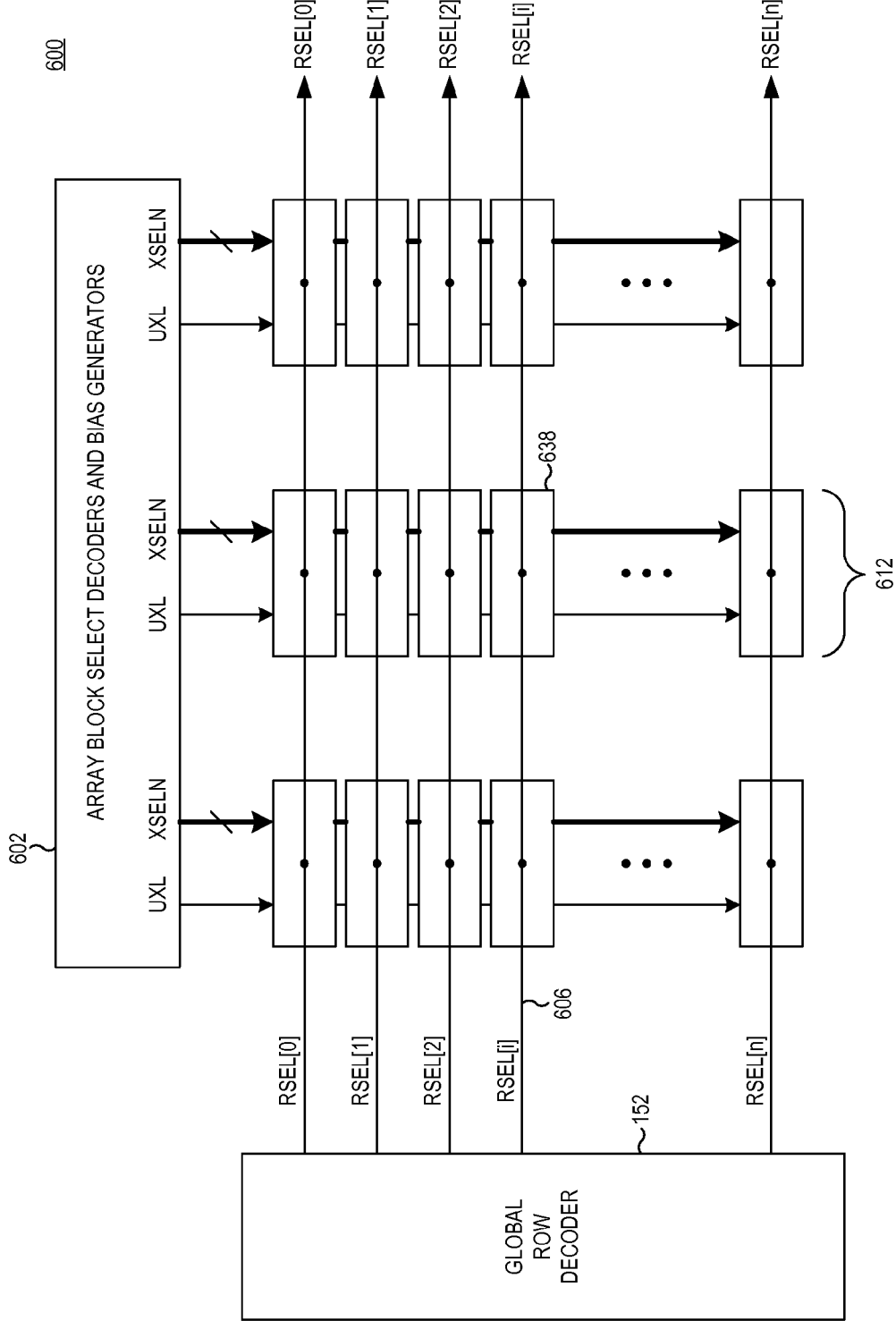
FIG. 15 is a block diagram depicting a global row decoder arrangement in which row select lines drive multi-headed word line drivers for each of a plurality of array blocks.

Referring now to FIG. 15, a block diagram is shown representing a multi-headed word line decoder 600 having multiple four-headed driver circuits, such as that depicted in FIG. 14, spaced across at least a portion of the memory array. The global row decoder 152 generates a plurality of decoded row select (RSEL) lines, labeled RSEL[0], RSEL[1], . . . RSEL[n], one of which (e.g., RSEL[ ]) is labeled 606, as before. The array block select decoders and bias generators circuit 602 generates four decoded source selection bus lines XSELN and one UXL bias line for each vertical group 612 of multi-headed word line driver circuits. Each multi-headed word line driver circuit (e.g., 638) is responsive to a respective one of the RSEL lines generated by the global row decoder 152. Similar array block organizations are disclosed in the aforementioned U.S. Pat. No. 6,879,505 to Roy E. Scheuerlein, particularly in relation to FIG. 10 thereof.

Figure 16:
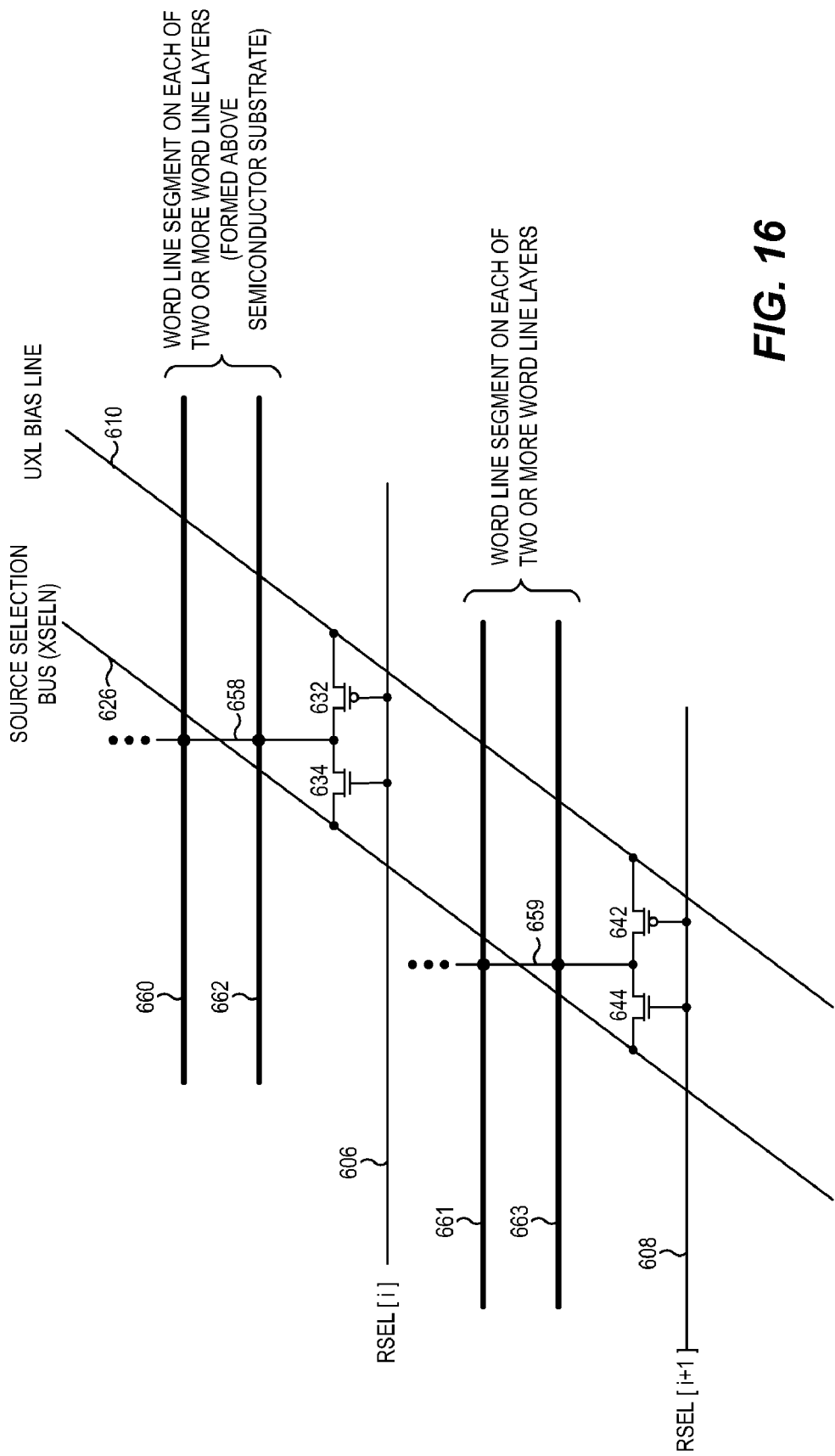
FIG. 16 is a three-dimensional view depicting a portion of a three-dimensional memory array, consistent with certain embodiments of that illustrated in FIG. 14 and FIG. 15, and illustrating a word line driver circuit coupled by way of a vertical connection to a respective word line segment in each of two adjacent array blocks, and on each of two or more word line layers.

Referring now to FIG. 16, a schematic diagram is shown representing a useful three-dimensional memory array having a segmented word line arrangement. Each word line is formed by one or more word line segments on at least one, and advantageously more than one, word line layer of the memory array. For example, a first word line is formed by word line segment 660 disposed on one word line layer of the memory array and by word line segment 662 disposed on another word line layer. The word line segments 660, 662 are connected by a vertical connection 658 to form the first word line. The vertical connection 658 also provides a connection path to the word line driver devices 634, 632 typically disposed in another layer (e.g., within the semiconductor substrate). A RSEL output 606 from a global row decoder (not shown) traverses substantially parallel to the word line segments 660, 662 and, at times, couples the word line segments 660, 662 through device 634 to a decoded source selection bus line XSELN 626 which traverses substantially perpendicular to the word line segments, and at other times couples the word line segments 660, 662 through device 632 to the UXL bias line 610.

Also shown are word line segments 661, 663 which are connected by a vertical connection 659 to form a second word line and to provide a connection path to the word line driver circuit 642, 644, which is coupled to a second RSEL output 608. While this figure describes an exemplary array configuration, other embodiments are contemplated for use with the decoder circuits described herein. For example, a memory array having a single memory plane may advantageously utilize the concepts described herein. In other embodiments with fully-mirrored 3D arrangement of memory layers (i.e., word lines shared vertically by two memory planes and bit lines shared by two memory planes) word line segments 661 and 663 may be disposed on only odd word line layers, and additional word line segments for even word line layers driven by a separate word line driver (not shown) controlled by the same RSEL line 608 but connected to a different bus line of the source selection bus (XSELN). The separate driver connection ensures unique selection of a cell in spite of the fully mirrored sharing of word lines and bit lines. Such a fully mirrored memory array is more fully disclosed in the aforementioned U.S. Pat. No. 6,879,505 to Roy E. Scheuerlein, particularly in relation to FIG. 4 thereof.

In certain preferred embodiments, a six-headed word line driver is utilized. The six word lines associated with such a six-headed word line driver circuit are common to two adjacent memory blocks, as described in U.S. Pat. No. 7,054,219 mentioned below. In other words, a given six-headed word line driver decodes and drives six word lines in each of two adjacent blocks. These adjacent blocks may be viewed as being respectively to the left and to the right of the associated word line drivers. However, in preferred embodiments such multi-headed word line drivers are disposed substantially beneath the array blocks, and only the vertical connections to the word lines made between the blocks.

Certain embodiments are contemplated having non-mirrored arrays (e.g., a word line layer associated with only a single bit line layer), such as is described in U.S. application Ser. No. 11/095,907 filed Mar. 31, 2005, by Luca G. Fasoli, et al., entitled "Method and Apparatus for Incorporating Block Redundancy in a Memory Array" (now U.S. Pat. No. 7,142, 471), the disclosure of which is hereby incorporated by reference in its entirety. In particular, FIG. 15 of such application shows 4 bit line layers, a 16-headed column decoder on both the top and the bottom sides of an array block. This figure shows 4 bit lines on each of 4 bit line layers being coupled by a single 16-headed column decoder to the top data bus (describing 4 I/O layers), and likewise 4 bit lines on each of the same 4 bit line layers being coupled by a single 16-headed column decoder to the bottom data bus (although in that description, the two groups of 16 selected bit lines were located within the same array block). Other half-mirrored embodiments are contemplated, such as those sharing a word line layer with two bit line layers, to form two memory planes. Other fully-mirrored embodiments are also contemplated, such as those sharing a word line layer with two bit line layers to form two memory planes, and sharing a bit line layer with two word line layers to form two memory planes, so that N+1 array line layers (each being a word line layer or bit line layer) forms N memory planes.

Figure 17:
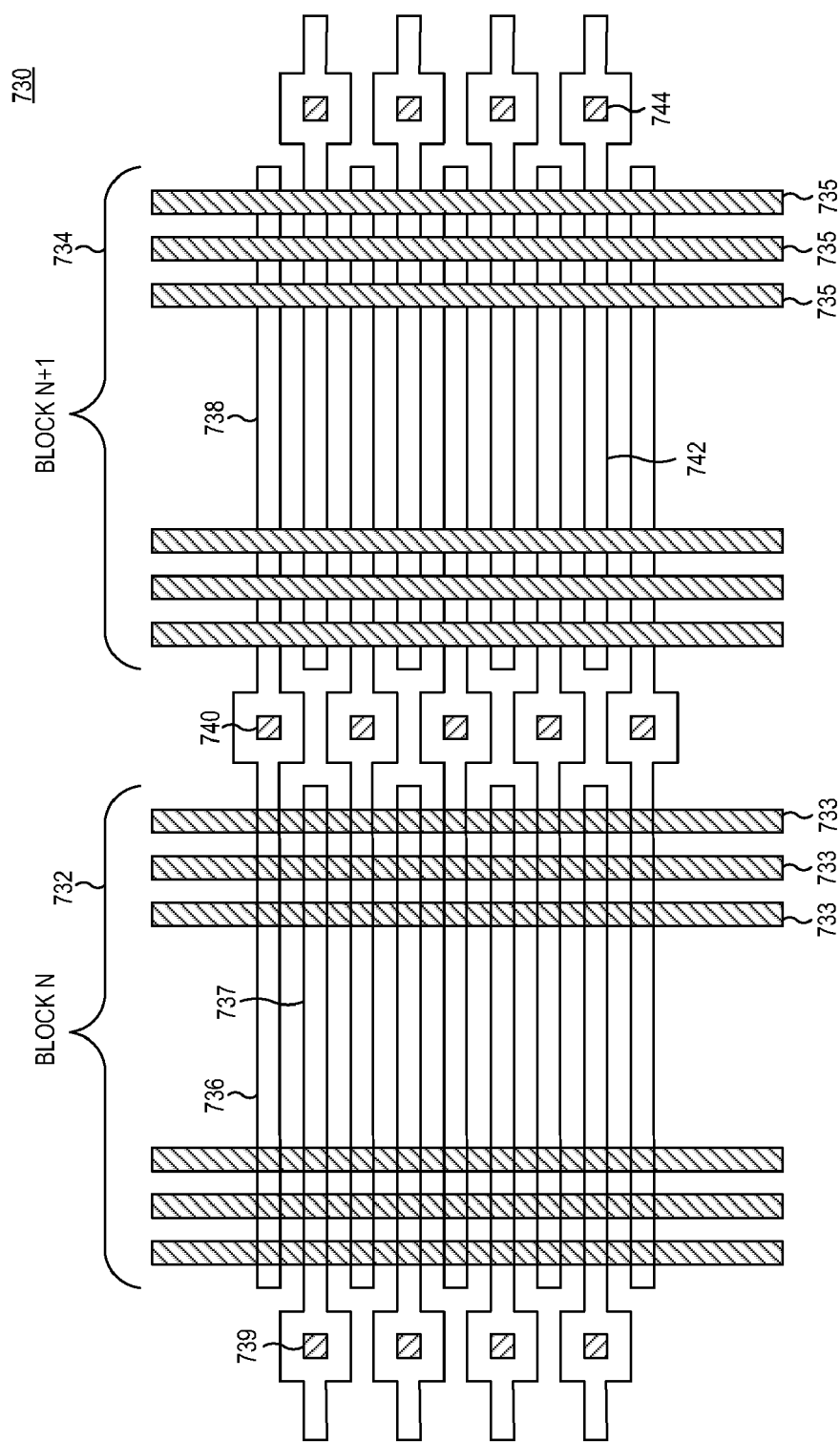
FIG. 17 is a top view representing a word line layer and a bit line layer of a three-dimensional memory array, which shows 2:1 interleaved word line segments, where vertical connections to half of the word line segments for a block are on the left side of the block, and vertical connections to the other half of the word line segments for the block are on the right side of the block. In addition, a word line segment from two adjacent blocks shares each vertical connection.

FIG. 17 is a top view representing a word line layer and a bit line layer of a three-dimensional memory array in accordance with certain embodiments of the present invention. Other word line layers and bit line layers may be implemented with those shown and would, in some embodiments, share the same vertical connections. Memory blocks 732, 734 are shown respectively including a plurality of bit lines 733, 735, and having 2:1 interleaved word line segments. Vertical connections to half of the word line segments for a block are on the left side of the block (e.g., word line segment 737 and vertical connection 739), and vertical connections to the other half of the word line segments for the block are on the right side of the block (e.g., word line segment 736 and vertical connection 740). In addition, each vertical connection serves a word line segment in each of two adjacent blocks. For example, vertical connection 740 connects to word line segment 736 in array block 732 and connects to word line segment 738 in array block 734. In other words, each vertical connection (such as vertical connection 740) is shared by a word line segment in each of two adjacent blocks. As would be expected, however, the respective "outside" vertical connections for the first and last array blocks may serve only word line segments in the first and last array blocks. For example, if block 734 is the last block of a plurality of blocks forming a memory array (or a memory bay), its outside vertical connections (e.g., vertical connection 744) may serve only the word line segment 742 within block 734, and are thus not shared by two word line segments as throughout the remainder of the array.

By interleaving the word line segments as shown, the pitch of the vertical connections is twice the pitch of the individual word line segments themselves. This is particularly advantageous since the word line pitch which is achievable for many passive element memory cell arrays is significantly smaller than achievable for many via structures which might be employed to form the vertical connections. Moreover, this also may reduce the complexity of the word line driver circuitry to be implemented in the semiconductor substrate below the memory array.

Figure 18:
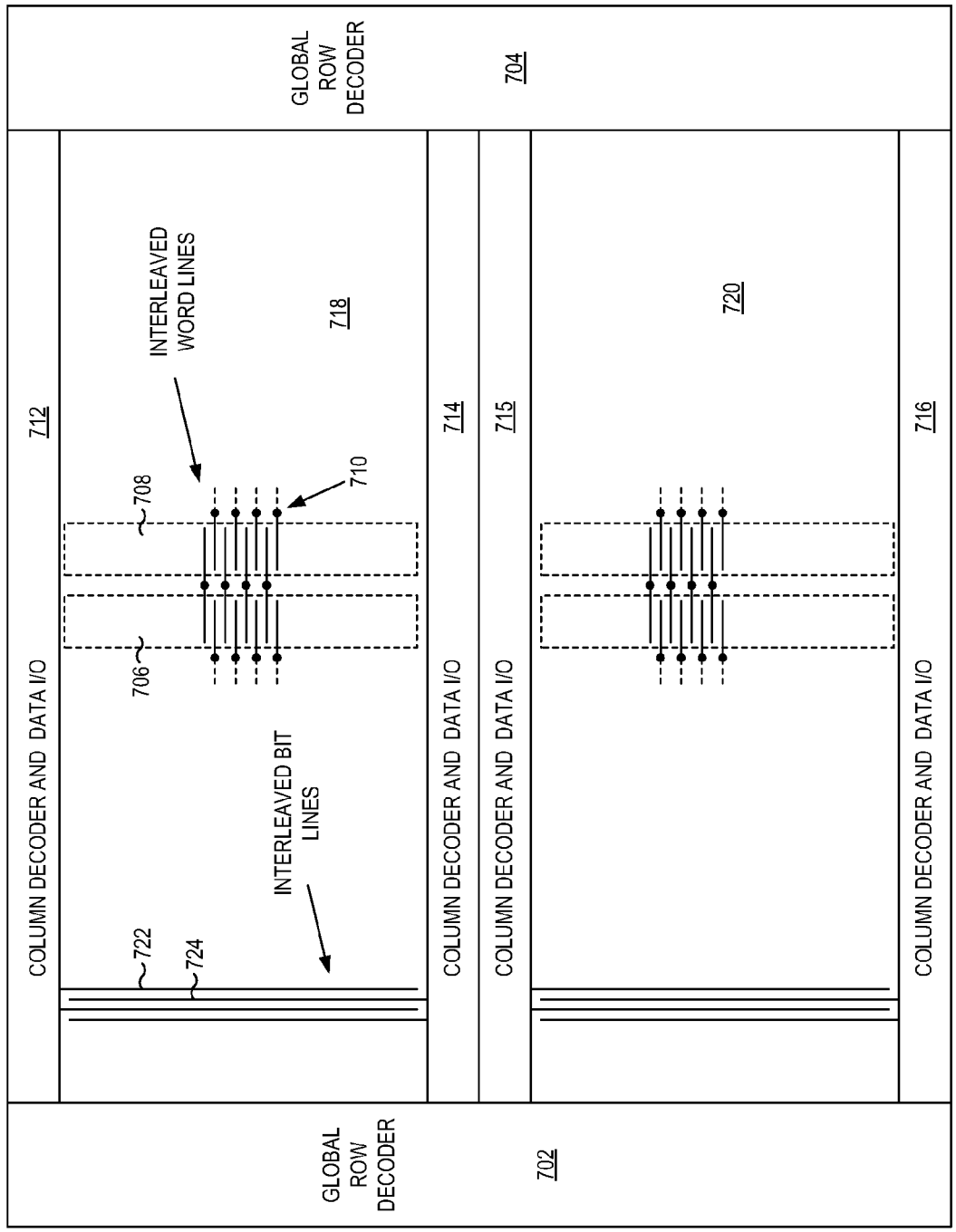
FIG. 18 is a block diagram depicting an exemplary integrated circuit including a three-dimensional memory array, and which integrated circuit includes a respective global row decoder on both sides of each array, and a respective column decoder on both top and bottom of each array.

FIG. 18 is a block diagram of an exemplary memory array 700. Dual global row decoders 702, 704 generate row select lines for the array, which each traverse across the array 700. In this embodiment, the word line driver circuits (not shown) are spatially distributed beneath the memory array and make connection to the word lines by way of vertical connections (one of which is labeled 710) on alternating sides of individual memory array blocks (two which are labeled 706, 708). The memory array shown includes two memory "stripes" 718, 720, and further includes four column decoder and bit line circuit blocks 712, 714, 715, 716 respectively at the top, upper middle, lower middle, and bottom of the array. Additional stripes may also be incorporated, and each stripe may include one or more memory bays. The bit lines within each block are also preferably 2:1 interleaved to relax the pitch requirements of the column related circuitry. As an example, bit line 722 is associated with (i.e., driven and sensed by) the upper column circuit block 712, while bit line 724 is associated with the upper middle column circuits block 714.

In exemplary embodiments, the memory array 700 is a three-dimensional memory array of passive element memory cells formed on each of four memory planes (or other number of memory planes). Such memory cells may incorporate a trimmable resistor element, as described herein, and may also include an antifuse. Such memory cells may incorporate punch-through diodes or ovonic switching devices instead of junction diodes. Each logical word line may be connected to a word line segment on each of four word line layers (each associated with a respective memory plane).

Each stripe of the memory array 700 is divided into a large number of array blocks, such as array block 708. In certain exemplary embodiments described herein, each memory bay includes 16 array blocks, but other numbers of blocks may be implemented. In an exemplary embodiment, each block may include 288 bit lines on each of four bit line layers for the respective four memory planes, thus totaling 1,152 bit lines per block. The bit lines are 2:1 interleaved, so that each of the column decoder and data I/O circuits at the top and bottom of an array block interfaces to 576 bit lines. Other numbers and arrangements of such bit lines and array blocks, including higher numbers, are also contemplated.

In a selected memory array block, one of these source selection bus lines XSELN is decoded and driven to an active bias condition by a row bias circuit, and remaining bus lines (also called "bias lines") are driven to an inactive condition (i.e., a voltage suitable for an unselected word line). Consequently, a single selected RSEL line (i.e., row select line, which corresponds to the decoded output node 158 in FIG. 3) preferably drives one word line active in the selected memory block, and drives the other N−1 word lines in the selected block to an unselected bias level. In other non-selected memory blocks, none of the individual bus lines of the source selection busses are driven active, so that no word lines are selected by the active RSEL line. Alternatively, the source selection bus lines and UXL bias line in unselected array blocks may be left floating, particularly in the forward mode. For example, a selected block may be adjacent to a second block that does not share the selected word line, and such second block may be floating. Unselected interleaved word lines may extend into that block and cause the block to float to the unselected word line bias. Similarly there may be a block adjacent to a selected block that shares only unselected interleaved bit lines with the selected block, and such a block may be left floating and all array lines will float to about the unselected bit line voltage.

Each row select line traverses across all the memory blocks in the entire memory stripe, and drives a respective four-headed word line driver located "between" each pair of blocks of the stripe (as well as two more, each respectively located "outside" the first and last blocks). The RSEL lines may also be known as ROWSEL lines and also "global row lines," and may also correspond to the row decoder output nodes referred to herein. Additional details of exemplary circuits, operation, bias conditions, float conditions, modes of operation including read and program modes, and the like, which may be useful are further described in the aforementioned U.S. Pat. No. 6,879,505, and additionally described in U.S. Pat. No. 7,054,219 to Christopher J. Petti, et al., entitled "Transistor Layout Configuration for Tight-Pitched Memory Array Lines", the disclosure of which is hereby incorporated by reference in its entirety, and further in U.S. application Ser. No. 11/146,952 filed on Jun. 7, 2005 by Roy E. Scheuerlein, et al., entitled "Decoding Circuit for Non-Binary Groups of Memory Line Drivers", the disclosure of which is hereby incorporated by reference in its entirety.

To speed up the selection time of a global row line, these RSEL lines may be driven at both ends thereof by two hierarchical row select decoders 702, 704 (also known as "global row decoders 702, 704"), each respectively located outside the array at left and right sides of the array stripe. By using a hierarchical decoder structure, the size of the global row decoder 702 is reduced, thus improving the array efficiency. In addition, a reverse decoding mode may be conveniently provided for improved testing capability, as further described in "Dual-Mode Decoder Circuit, Integrated Circuit Memory Array Incorporating Same, and Related Methods of Operation" by Kenneth K. So, et al., U.S. application Ser. No. 11/026,493 filed Dec. 30, 2004, the disclosure of which is hereby incorporated by reference in its entirety. Exemplary circuits for such hierarchical decoders may be found in "Apparatus and Method for Hierarchical Decoding of Dense Memory Arrays Using Multiple Levels of Multiple-Headed Decoders," by Luca G. Fasoli, et al., U.S. Patent Application Publication No. 2006-0146639 A1, the disclosure of which is hereby incorporated by reference in its entirety.

In certain textual materials incorporated by reference herein, an exemplary four-headed decoder circuit includes four "selected" bias lines and a single unselected bias line. The rationale for such a name is because a given decoder head couples its output to a "selected" bias line if the input to the decoder head is selected (i.e., driven to an active level). However, by no means does this imply that all four of the heads shown drive their respective outputs to a level that is reflective of the output being selected, because typically only one of the selected bias lines is actually biased in a condition suitable for a selected output, and the remaining three selected bias lines are biased in a condition suitable for an unselected output. These "selected" bias lines for a multi-headed decoder are described herein as a "source selection bus," but operate similarly, except as noted. Some of these textual materials also describe embodiments which include a second such bus, being a "reverse source selection bus" rather than a single unselected bias line, such as described in the aforementioned U.S. Pat. No. 7,486,587.

Conversely, if the input node for the multi-headed decoder is inactive or unselected, then all such heads drive their respective outputs to an associated "unselected" bias line (or respective bus line of a reverse source selection bus). For many useful embodiments, such unselected bias lines may be combined into a single bias line shared by all heads of the multi-headed decoder.

Related word line decoder structures and techniques, including additional hierarchical levels of such decoding, bias circuit organization for the decoded busses, and related supporting circuits, are further described in U.S. Pat. No. 6,856,572 by Roy E. Scheuerlein, et al., entitled "Multi-Headed Decoder Structure Utilizing Memory Array Line Driver with Dual Purpose Driver Device," the disclosure of which is hereby incorporated by reference in its entirety; in U.S. Pat. No. 6,859,410 by Roy E. Scheuerlein, et al., entitled "Tree Decoder Structure Particularly Well-Suited to Interfacing Array Lines Having Extremely Small Layout Pitch," the disclosure of which is hereby incorporated by reference in its entirety; and in U.S. Pat. No. 7,525,869 by Tianhong Yan, et al., entitled "Method for Using a Reversible Polarity Decoder Circuit," the disclosure of which is hereby incorporated by reference in its entirety.

Figure 19:
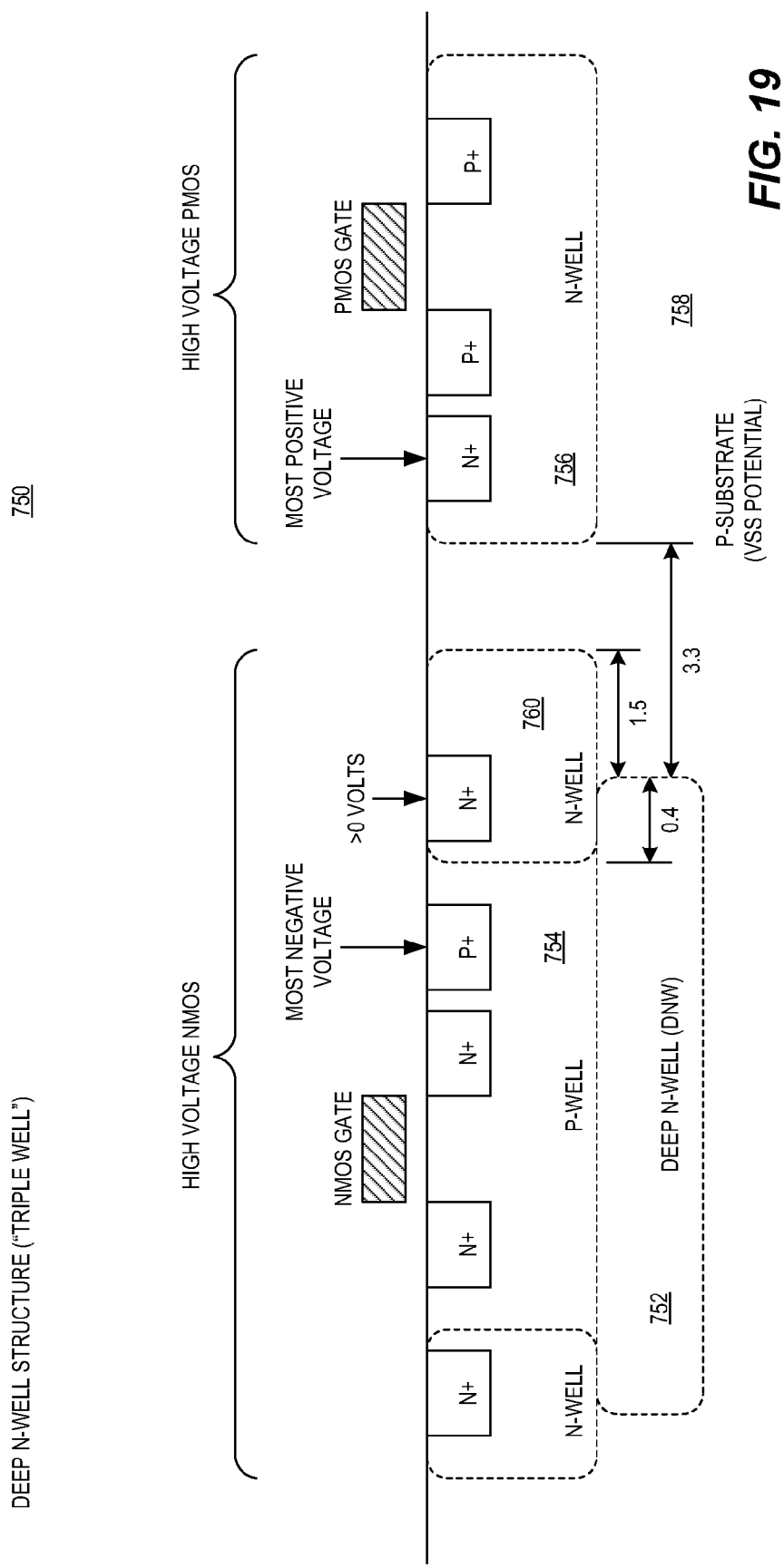
FIG. 19 is a cross-section diagram of a triple well structure incorporating a deep n-well semiconductor structure.

Referring now to FIG. 19, a triple well structure is depicted, which is utilized to provide for certain source/drain nodes to be able to be driven above and below the potential of the bulk substrate 758 (e.g., VSS) which is necessary to achieve the dual polarity decoder outputs. The PMOS devices (e.g., a representative one shown on the right side of the figure) are formed in a traditional N-well 756. The NMOS devices (e.g., a representative one shown on the left side of the figure) are enclosed in a triple well structure where an intermediate depth P-well 754 is surrounded by a deep N-well 752. All the N-wells 756 for the PMOS devices share the most positive voltage in each mode of operation, and all the P-wells 754 for the NMOS devices share the most negative voltage in each mode of operation.

Figure 20:
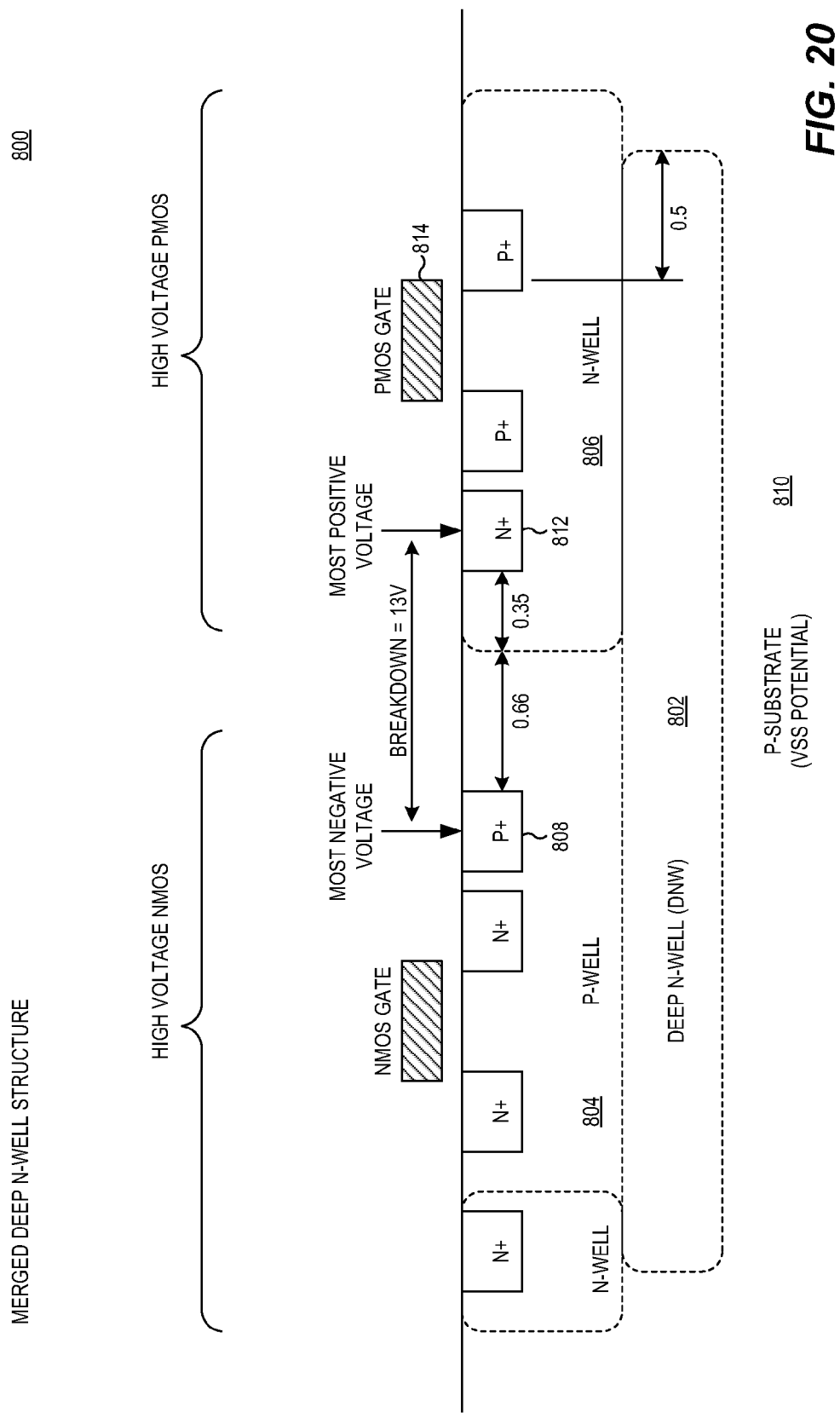
FIG. 20 is a cross-section diagram of a triple well structure incorporating a merged deep n-well semiconductor structure.

Referring now to FIG. 20, an improved triple well structure is depicted. The PMOS devices are enclosed in a deep N-Well 802. The NMOS devices are in a triple well structure where an intermediate depth P-Well 804 is enclosed by the same deep N-Well 802 used for the PMOS devices. Layout of the transfer gates is compacted by merging the PMOS deep N-Well and the NMOS triple well deep N-Well. This is possible because the source and drain voltages of the transfer gate circuit NMOS and PMOS transistors are common voltages (i.e., the NMOS and PMOS transistors of each coupling circuit in the decoder output driver circuit are connected in parallel).

As before, all the N-wells 806 for the PMOS devices share the most positive voltage in each mode of operation (being coupled to N+ region 812), and all the P-wells 804 for the NMOS devices share the most negative voltage in each mode of operation (being coupled to P+ region 808). In addition, the entire decoder output driver circuit can use a common deep N-Well 802 at the N-well 806 bias voltage. This merged structure avoids having any deep N-well 752 to N-well 756 spacing limitations (as indicated in FIG. 19).

As used herein, the term "set" shall be viewed as forward biasing a single (or group of) memory cells, to cause a lower resistance through each memory cell. The term "reset" shall be viewed as reverse biasing a memory cell to cause a higher resistance through each such cell.

In certain embodiments the memory array may be formed "above" the substrate, and various circuit blocks being described as being "below" or "beneath" the memory array. As used herein, being "above" or "below" or "beneath" a memory array block, which are actual physical structures having generally a planar character, is relative to a direction normal to the surface of such a substrate or memory plane.

As stated above, preferably the memory array includes a segmented word line architecture (as depicted in FIG. 14), and preferably a 3D array. In certain embodiments, the word lines on a given word line layer are associated with bit lines on a single bit line layer, while in certain embodiments the word lines on a given word line layer are shared between two bit line layers (i.e., a single word line layer and two bit line layers defining two memory planes) in a so-called "half-mirrored" arrangement. In certain embodiments, the word lines on a given word line layer are shared between two bit line layers, and the bit lines on a given bit line layer are shared between two word line layers, in a so-called "fully-mirrored" arrangement. Such memory array structures are described further in the aforementioned U.S. Pat. No. 6,879,505.

The description of the various decoder circuits thus far has largely focused on describing a single array block. Recall that each decoder has been described in the context of a source selection bus. The word line decoder hierarchy may be viewed as relatively straightforward. The source selection bus and unselected bias line are decoded based upon address information, and driven according to which array block is active. Similar row decoder circuits are referred to already elsewhere herein. The respective source selection bus and/or unselected bias lines for word lines associated with unselected array blocks may be left floating if they do not share the selected word line with the selected array block. If such unselected array blocks share the selected word line with the selected array block, the unselected word line bias is preferably supplied.

Useful column decoder arrangements may be found in the aforementioned U.S. application Ser. No. 11/095,907, and in the aforementioned U.S. Patent Application Publication No. 2006-0146639 A1. A hierarchical bus arrangement may be employed to provide efficient routing of read/write data, and efficient biasing of bit lines within selected and unselected array blocks. Useful hierarchical bus arrangements are described in U.S. application Ser. No. 11/461,359, now U.S. Publication No. 2008-0025085, entitled "Memory Array Incorporating Two Data Busses for Memory Array Block Selection" by Roy E. Scheuerlein, Luca G. Fasoli, and Christopher J. Petti (the "023-0052" application), and in U.S. application Ser. No. 11/461,362, now U.S. Publication No. 2008-0025093, entitled "Hierarchical Bit Line Bias Bus for Block Selectable Memory Array" by Roy E. Scheuerlein and Luca G. Fasoli (the "023-0053" application), both of which are incorporated by reference herein.

In the forward operations (read and set) an exemplary hierarchical bus arrangement provides a suitable bias on the XSELN bus for a selected array block, and leaves the XSELN bus for unselected array blocks floating. This is helpful to reduce unwanted power dissipation in the array blocks adjacent to a selected array block. The unselected word lines in a selected array block are biased at a fairly high voltage VUX (e.g., VPP–VT), and with a shared word line architecture these unselected word lines also extend to the adjacent non-selected array block (i.e., half of the word lines within the non-selected array block being shared with the selected array block). The unselected bit lines in the adjacent array block that also shares the selected word line preferably are biased at the unselected bit line voltage, VUB (e.g., VT). This consumes power due to the leakage currents through unselected memory cells. The other half of the word lines in the adjacent non-selected array block are floating, so that they leak up to the VUB voltage, and leakage power is minimized for half of the unselected cells. In other adjacent blocks that share unselected word lines but not the selected word line, the bit lines are left floating, and float to the unselected word line voltage, thus avoiding the power dissipation of unselected cells.

As regards various embodiments described above, many types of memory cells are capable of being programmed using a reverse bias (e.g., the reset mode described above). Such cells include a passive element cell having a metal oxide (e.g., a transition metal oxide) and a diode. Other suitable cells include those having a resistive material in a diode matrix. Examples include a programmable metallization connection, a phase change resistor such as GST material, an organic material variable resistor, a complex metal oxide, a carbon polymer film, a doped chalcogenide glass, and a Schottky barrier diode containing mobile atoms to change resistance. The resistive material chosen may provide one-time-programmable (OTP) memory cells, or write-many memory cells. In addition, a polysilicon diode could be employed having conduction modified by reverse bias stress.

Useful memory cells for reverse reset operation are described in U.S. Pat. No. 6,952,030 entitled "High-Density Three-Dimensional Memory Cell" to S. Brad Herner, et al.; and also in U.S. application Ser. No. 11/237,167 entitled "Method for Using a Memory Cell Comprising Switchable Semiconductor Memory Element with Trimmable Resistance" by Tanmay Kumar, et al., filed on Sep. 28, 2005. A suitable metal oxide memory cell is shown in U.S. application Ser. No. 11/394,903 filed on Mar. 31, 2006, entitled "Multi-level Nonvolatile Memory Cell Comprising a Resistivity-Switching Oxide or Nitride and an Antifuse" by S. Brad Herner. A suitable memory cell using a phase change material, which can provide multiple resistance states, is shown in U.S. Patent Application Publication No. 2005-0158950 entitled "Non-Volatile Memory Cell Comprising a Dielectric Layer and a Phase Change Material in Series" by Roy E. Scheuerlein, et al. Each of these above-referenced disclosures is incorporated herein by reference in its entirety. Other exemplary memory cells having a transition-metal oxide (e.g., including those having cobalt), and exemplary cells in which the polysilicon material of the steering element itself comprises the switchable resistance material, are described in the MA-163-1 application referenced below.

In addition, U.S. application Ser. No. 11/125,939 filed on May 9, 2005, entitled "Rewritable Memory Cell Comprising a Diode and a Resistance Switching Material" by S. Brad Herner, et al., discloses a useful rewritable memory cell incorporating a diode in series with an oxide, such as a nickel oxide, in which the resistance of the memory cell may be repeatedly switched from low to high and from high to low resistance states. U.S. application Ser. No. 11/395,995 filed on Mar. 31, 2006, entitled "Nonvolatile Memory Cell Comprising a Diode and a Resistance Switching Material" by S. Brad Herner, et al., discloses a OTP multi-level memory cell which is set using forward bias and reset using reverse bias. Each of these above-referenced disclosures is incorporated herein by reference in its entirety.

In many of the embodiments described herein, the precise bias conditions imposed upon each respective bus line in the data path is independently controllable. The specific voltage and current settings for each of the set and reset drivers can be adjusted for each bit of the data path. As a result, certain memory cells having more than two states (i.e., "multi-level" memory cells) are contemplated for use with many of the structures described herein. Exemplary multi-level memory cells are described in the aforementioned U.S. application Ser. No. 11/237,167, and in the MA-163-1 application, referenced below.

Exemplary passive element memory cells and related non-volatile memory structures which may be useful in practicing the present invention are described the following documents, each of which is incorporated herein by reference in its entirety:

- U.S. Pat. No. 6,034,882 entitled "Vertically Stacked Field Programmable Nonvolatile Memory and Method of Fabrication" to Mark G. Johnson, et al.;
- U.S. Pat. No. 6,420,215 entitled "Three Dimensional Memory Array and Method of Fabrication" to N. Johan Knall, et al.;
- U.S. Pat. No. 6,525,953 entitled "Vertically-Stacked, Field Programmable, Nonvolatile Memory and Method of Fabrication" to Mark Johnson, et al.;
- U.S. Pat. No. 6,490,218 entitled "Digital Memory Method and System for Storing Multiple-Bit Digital Data" to Michael Vyvoda, et al.;
- U.S. Pat. No. 6,952,043 entitled "Electrically Isolated Pillars in Active Devices" to Michael Vyvoda, et al.; and
- U.S. Patent Application Publication No. US2005-0052915 entitled "Nonvolatile Memory Cell Without a Dielectric Antifuse Having High- and Low-Impedance States" by S. Brad Herner, et al.

Memory cell structures, circuits, systems, and methods that may be useful in practicing the present invention, are described in the following applications, each filed on Jul. 31, 2006, each of which is incorporated herein by reference in its entirety:

- U.S. application Ser. No. 11/496,985, now U.S. Publication No. 2007-0069276, entitled "Multi-Use Memory Cell and Memory Array" by Roy Scheuerlein and Tanmay Kumar (the "10519-141" application);
- U.S. application Ser. No. 11/496,984, now U.S. Publication No. 2007-0070690, entitled "Method for Using a Multi-Use Memory Cell and Memory Array" by Roy Scheuerlein and Tanmay Kumar (the "10519-150" application);
- U.S. application Ser. No. 11/496,874, now U.S. Publication No. 2008-0023790, entitled "Mixed-Use Memory Array" by Roy Scheuerlein (the "10519-142" application);
- U.S. application Ser. No. 11/496,983, now U.S. Publication No. 2008-0025118, entitled "Method for Using a Mixed-Use Memory Array" by Roy Scheuerlein (the "10519-151" application);
- U.S. application Ser. No. 11/496,870, now U.S. Publication No. 2008-0025069, entitled "Mixed-Use Memory Array With Different Data States" by Roy Scheuerlein and Christopher Petti (the "10519-149" application);
- U.S. application Ser. No. 11/497,021, now U.S. Publication No. 2008-0025062, entitled "Method for Using a Mixed-Use Memory Array With Different Data States" by Roy Scheuerlein and Christopher Petti (the "10519-152" application);
- U.S. application Ser. No. 11/461,393, now U.S. Publication No. 2008-0025076, entitled "Controlled Pulse Operations in Non-Volatile Memory" by Roy Scheuerlein (the "SAND-01114US0" application);
- U.S. application Ser. No. 11/461,399, now U.S. Publication No. 2008-0025077, entitled "Systems for Controlled Pulse Operations in Non-Volatile Memory" by Roy Scheuerlein (the "SAND-01114US1" application);
- U.S. application Ser. No. 11/461,410, now U.S. Publication No. 2008-0025061, entitled "High Bandwidth One-Time Field-Programmable Memory" by Roy Scheuerlein and Christopher J. Petti (the "SAND-01115US0" application);
- U.S. application Ser. No. 11/461,419, now U.S. Publication No. 2008-0025067, entitled "Systems for High Bandwidth One-Time Field-Programmable Memory" by Roy Scheuerlein and Christopher J. Petti (the "SAND-01115US1" application);
- U.S. application Ser. No. 11/461,424, now U.S. Publication No. 2008-0025068, entitled "Reverse Bias Trim Operations in Non-Volatile Memory" by Roy Scheuerlein and Tanmay Kumar (the "SAND-01117US0" application);
- U.S. application Ser. No. 11/461,431, now U.S. Publication No. 2008-0025078, entitled "Systems for Reverse Bias Trim Operations in Non-Volatile Memory" by Roy Scheuerlein and Tanmay Kumar (the "SAND-01117US1" application);
- U.S. application Ser. No. 11/496,986, now U.S. Publication No. 2007-0072360, entitled "Method for Using a Memory Cell Comprising Switchable Semiconductor Memory Element with Trimmable Resistance" by Tanmay Kumar, S. Brad Herner, Roy E. Scheuerlein, and Christopher J. Petti (the "MA-163-1" application);
- U.S. application Ser. No. 11/461,339, now U.S. Publication No. 2008-0025066, entitled "Passive Element Memory Array Incorporating Reversible Polarity Word Line and Bit Line Decoders" by Luca G. Fasoli, Christopher J. Petti, and Roy E. Scheuerlein (the "023-0048" application);
- U.S. application Ser. No. 11/461,364, now U.S. Publication No. 2008-0025132, entitled "Method for Using a Passive Element Memory Array Incorporating Reversible Polarity Word Line and Bit Line Decoders" by Luca G. Fasoli, Christopher J. Petti, and Roy E. Scheuerlein (the "023-0054" application);
- U.S. application Ser. No. 11/461,343, now U.S. Publication No. 2008-0025088, entitled "Apparatus for Reading a Multi-Level Passive Element Memory Cell Array" by Roy E. Scheuerlein, Tyler Thorp, and Luca G. Fasoli (the "023-0049" application);
- U.S. application Ser. No. 11/461,367, now U.S. Publication No. 2008-0025089, entitled "Method for Reading a Multi-Level Passive Element Memory Cell Array" by Roy E. Scheuerlein, Tyler Thorp, and Luca G. Fasoli (the "023-0055" application);
- U.S. application Ser. No. 11/461,352, now U.S. Publication No. 2008-0025131, entitled "Dual Data-Dependent Busses for Coupling Read/Write Circuits to a Memory Array" by Roy E. Scheuerlein and Luca G. Fasoli (the "023-0051" application);
- U.S. application Ser. No. 11/461,369, now U.S. Publication No. 2008-0025133, entitled "Method for Using Dual Data-Dependent Busses for Coupling Read/Write Circuits to a Memory Array" by Roy E. Scheuerlein and Luca G. Fasoli (the "023-0056" application);
- U.S. application Ser. No. 11/461,359, now U.S. Publication No. 2008-0025085, entitled "Memory Array Incorporating Two Data Busses for Memory Array Block Selection" by Roy E. Scheuerlein, Luca G. Fasoli, and Christopher J. Petti (the "023-0052" application);
- U.S. application Ser. No. 11/461,372, now U.S. Publication No. 2008-0025134, entitled "Method for Using Two Data Busses for Memory Array Block Selection" by Roy E. Scheuerlein, Luca G. Fasoli, and Christopher J. Petti (the "023-0057" application);
- U.S. application Ser. No. 11/461,362, now U.S. Publication No. 2008-0025093, entitled "Hierarchical Bit Line Bias Bus for Block Selectable Memory Array" by Roy E. Scheuerlein and Luca G. Fasoli (the "023-0053" application); and U.S. application Ser. No. 11/461,376, now U.S. Publication No. 2008-0025094, entitled "Method for Using a Hierarchical Bit Line Bias Bus for Block Selectable Memory Array" by Roy E. Scheuerlein and Luca G. Fasoli (the "023-0058" application).

As should be appreciated, specific exemplary embodiments shown herein have been described in the context of specific numeric examples, such as particular voltages, the number of decoded outputs, the number of decoder heads, the number of bus lines, the number of data busses, the number of array blocks within a memory bay, and the number of memory stripes. Other variations consistent with other design objectives may be implemented using the teachings of this disclosure. In the interest of clarity, not all of the routine features of the implementations described herein are shown and described.

As used herein, "coupling selected bit lines to a first bus" means respectively coupling each such selected bit line to a corresponding bus line of the first bus. As used herein, word lines (e.g., including word line segments) and bit lines usually represent orthogonal array lines, and generally follow a common assumption in the art that word lines are driven and bit lines are sensed, at least during a read operation. Moreover, as used herein, a "global line" (e.g., a global select line) is an array line that spans more than one memory block, but no particular inference should be drawn suggesting such a global line must traverse across an entire memory array or substantially across an entire integrated circuit.

As used herein, a "data bus" or data bus "segment" conveys data-dependent information at least at times, but need not do so at all times. For example, such a data bus may convey identical bias information on each bus line of such a data bus for certain modes of operation. A "data circuit" may include one or more, or any combination, of a read/write circuit, a set circuit, a reset circuit, a read circuit, or a program circuit, as appropriate.

As used herein, "selected" lines, such as selected bit lines within an array block, correspond to such bit lines that are simultaneously selected by a multi-headed decoder circuit, and each coupled to a corresponding bus line. Such bit lines may or may not also be selected by data or I/O circuits to actually perform a given read, program, set, reset, or erase operation. For example, if a 16-headed column decoder simultaneously "selects" and couples 16 bit lines to a given bus (e.g., SELB bus), it is contemplated that none of the bit lines, one bit line, more than one bit line, or all the bit lines of this group of 16 bit lines, may actually receive a selected (i.e., active) bias condition suitable for the given mode of operation, while the remaining bit lines may receive an unselected (i.e., inactive) bias condition. Such a bus may be described as being a "data-dependent" bus. In other embodiments, there may be more than one such "selected" bias condition conveyed on a given bus, such as when two simultaneously selected memory cells are to be programmed to different data states.

As used herein, a passive element memory array includes a plurality of 2-terminal memory cells, each connected between an associated X-line (e.g., word line) and an associated Y-line (e.g., bit line). Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. A passive element memory array may be a one-time programmable (i.e., write once) memory array or a read/write (i.e., write many) memory array. Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

The directionality of various array lines in the various figures is merely convenient for ease of description of the two groups of crossing lines in the array. As used herein, an integrated circuit memory array is a monolithic integrated circuit structure, rather than more than one integrated circuit device packaged together or in close proximity.

As used herein, an "array block" or "memory array block" is a contiguous array of adjacent memory cells generally unbroken by decoders, read/write circuits, busses, or other structures. The "polarity" of a decoder circuit refers to a selected decoder output being active high or active low, irrespective of any operational voltage shift (e.g., one decoder having a selected output at +6 and unselected outputs at ground, has the same polarity as another decoder having a selected output at ground, and unselected outputs at −6V). As used herein, a circuit being "powered to a first voltage" means a first voltage differential is applied across such circuit, irrespective of the ground reference potential. The "operating voltage" of a circuit is the voltage differential between the upper supply voltage VHI and the lower supply voltage VLO (e.g., "operating voltage"=VHI−VLO), irrespective of polarity of one or more of these voltages. For example, a circuit having a VHI=+4V and a VLO=GND has a 4 volt operating voltage, as does a circuit having a VHI=GND and a VLO=−4V.

As used in certain descriptions herein, a "selected" bus line or bit line voltage or other bias condition is so described with respect to both a selected address and an appropriate data state for "writing" in a given mode of operation. For example a selected source select bus which is coupled to a selected bit line, in accordance with data state to be programmed, may carry a writing voltage to change the state of a selected memory cell associated with the selected bit line, or conversely may carry an inactive voltage to leave unchanged the state of the selected memory cell associated with the selected bit line. In other words, a bit line may be selected (i.e., "addressed") for writing, but the data state may inhibit an actual programming voltage to the "selected" bus line.

As used herein, each of a "first mode of operation" and a "second mode of operation" may refer to any of the described modes of operation, including standby, read, write, erase, block erase, program, set, reset, and block reset. A "write mode of operation" may refer to any mode of operation which serves to alter the state of one or more memory cells, whether also described as set, reset, block reset, erase, block erase, or program.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits.

Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, packaged modules including such circuits, systems utilizing such circuits and/or modules and/or other memory devices, related methods of operation, related methods for making such circuits, and computer-readable storage medium encodings of such circuits and methods, all as described herein, and as defined in the appended claims. As used herein, a computer-readable storage medium includes at least disk, tape, or other magnetic, optical, semiconductor (e.g., flash memory cards, ROM), or electronic storage medium. An encoding of a circuit may include circuit schematic information, physical layout information, behavioral simulation information, and/or may include any other encoding from which the circuit may be represented or communicated.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein. It is only the following claims, including all equivalents, that are intended to define the scope of this invention.

What is claimed is:

1. A method for decoding a memory array, said method comprising:
    providing a first decoder circuit with an operating voltage of a first magnitude until all decoded outputs thereof are stable and a first voltage differential is established between a selected and unselected decoded outputs thereof, each decoded output being coupled to a respective plurality of array line driver circuits; and
    providing a first inactive voltage level on each bus line of a source select bus, said source select bus coupled to each of the respective pluralities of array line driver circuits, each respective array line driver circuit of a given plurality of array line driver circuits for coupling a respective bus line of the source select bus to a respective array line of a first type responsive to a decoded output of the first decoder circuit coupled to the given plurality of array line driver circuits; then
    increasing the operating voltage of the first decoder circuit to a second magnitude larger than the first magnitude, to thereby increase the differential voltage between selected and unselected decoded outputs to a second differential voltage greater than the first differential voltage; then
    pulsing a first bus line of the source select bus to a first active voltage level then back to the first inactive voltage level, to thereby pulse a first array line of the first type corresponding to the selected decoded output of the first decoder circuit; then
    decreasing the operating voltage of the first decoder to the first magnitude before allowing any decoded outputs thereof to change states.

2. The method as recited in claim 1 further comprising:
    before the decreasing step, pulsing a second bus line of the source select bus to the first active voltage level, to thereby pulse a second array line of the first type corresponding to the selected decoded output of the first decoder circuit.

3. The method as recited in claim 1 further comprising:
    simultaneously with said pulsing a first bus line, pulsing a second bus line of the source select bus to the first active voltage level, to thereby pulse a second array line of the first type corresponding to the selected decoded output of the first decoder circuit.

4. The method as recited in claim 1 wherein:
    the selected decoded output, when the first decoder circuit has an operating voltage of the second magnitude, provides a gate overdrive to an associated array line driver circuit, to drive the associated array line of the first type fully to the first active voltage level conveyed on the associated bus line of the source select bus.

5. The method as recited in claim 1 further comprising:
    biasing all array lines of the first type to the first inactive voltage level before said increasing step; and
    providing a dominant leakage current within each array line driver circuit from each array line to the first inactive voltage level, to thereby maintain certain non-selected array lines of the first type at or near the first inactive voltage level when no transistor within an associated array line driver circuit is conductive.

6. The method as recited in claim 1 further comprising before the first-mentioned providing step:
    providing an upper supply voltage having a first value and a lower supply voltage having a second value to the first decoder circuit, deselecting all decoded outputs of the first decoder circuit, and biasing all bus lines of the source select bus to the first inactive voltage level, to thereby drive all array lines of the first type to the first inactive voltage level; then
    transitioning the upper supply voltage from the first value to a third value, and transitioning the lower supply voltage from the second value to a fourth value, while preserving the polarity of the first decoder circuit, wherein said third and fourth values provide said operating voltage of the first magnitude to the first decoder circuit.

7. The method as recited in claim 1 further comprising after the decreasing step:
    deselecting all decoded outputs of the first decoder circuit and biasing all bus lines of the source select bus to a second inactive voltage level, to thereby drive all array lines of the first type to the second inactive voltage level;
    transitioning an upper supply voltage coupled to the first decoder circuit from a first value to a third value, and transitioning a lower supply voltage coupled to the first decoder circuit from a second value to a fourth value, while preserving the polarity of the first decoder circuit, wherein said first and second values provide said operating voltage of the first magnitude to the first decoder circuit; and wherein said third and fourth values provide an operating voltage of a third magnitude to the first decoder circuit;
    maintaining the operating voltage of the third magnitude until all decoded outputs of the first decoder circuit are stable and a third voltage differential is established between a selected and unselected decoded outputs thereof; then
    increasing the operating voltage of the first decoder circuit to a fourth magnitude larger than the third magnitude, to thereby increase the differential voltage between selected and unselected decoded outputs to a fourth differential voltage greater than the third differential voltage; then
    pulsing a first bus line of the source select bus to a second active voltage level, to thereby pulse a first array line of the first type corresponding to the selected output of the first decoder circuit; then decreasing the operating voltage of the first decoder to the third magnitude before allowing any decoded outputs thereof to change states.

8. The method as recited in claim 7 wherein:
the first active voltage level is lower in voltage than the first inactive voltage level; and
the second active voltage level is higher in voltage than the second inactive voltage level.

9. The method as recited in claim 7 wherein:
one of the first and second active voltage levels is a positive voltage, and the other of the first and second active voltage levels is a negative voltage.

10. The method as recited in claim 7 wherein said transitioning the upper and lower supply voltages coupled to the first decoder circuit comprises:
voltage shifting the first decoder circuit from a "ground-up" operating voltage to a "ground-down" operating voltage, wherein the first value comprises a positive voltage, the second value and third value comprise a ground voltage, and the fourth value comprises a negative voltage.

11. The method as recited in claim 7 wherein:
the second magnitude of the operating voltage is identical to the fourth magnitude of the operating voltage.

12. An integrated circuit device comprising:
a memory array of memory cells, each memory cell coupled between an associated array line of a first type and an associated array line of a second type;
a first array line selection circuit comprising a first decoder circuit configured to generate a first plurality of decoded output nodes, each coupled to a respective multi-headed first-type array line driver circuit, and each multi-headed first-type array line driver circuit comprising a respective plurality of first array line driver circuits, each coupled to a respective array line of the first type; and
a second array line selection circuit comprising a second decoder circuit configured to generate a second plurality of decoded output nodes, each coupled to a respective multi-headed second-type array line driver circuit, and each multi-headed second-type array line driver circuit comprising a respective plurality of second array line driver circuits, each coupled to a respective array line of the second type;
wherein the first decoder circuit maintains the same polarity in both a first mode of operation and a second mode of operation;
wherein the second decoder circuit maintains the same polarity in both the first mode of operation and the second mode of operation;
wherein the multi-headed first-type array line driver circuits have a reverse polarity in the second mode of operation than in the first mode of operation;
wherein the multi-headed second-type array line driver circuits have a reverse polarity in the second mode of operation than in the first mode of operation; and
wherein the first and second array line selection circuits impress across a selected memory cell, in the first mode of operation, a bias voltage of opposite polarity than that impressed in the second mode of operation.

13. The device as recited in claim 12 wherein the multi-headed second-type array line driver circuits have a polarity opposite that of the multi-headed first-type array line driver circuits in both the first and second modes of operation.

14. The device of claim 13 wherein said memory cells are programmable in at least one of the first mode of operation and the second mode of operation.

15. The device as recited in claim 13 wherein:
in the first mode of operation, a selected array line of one of the first or second type is driven to ground, and a selected array line of the other of the first or second type is driven to a positive voltage; and
in the second mode of operation, a selected array line of one of the first or second type is driven to a positive voltage, a selected array line of the other of the first or second type is driven to a negative voltage, and unselected array lines of both the first and second types remain at ground.

16. The device as recited in claim 15 wherein, in the second mode of operation:
the second decoder circuit operates with a negative lower power supply voltage;
one or more selected bus lines of the second source selection bus are driven to a negative voltage, and unselected bus lines of the second source selection bus are driven to ground;
one or more selected array lines of the second type are driven to a negative voltage;
the first decoder operates with a positive upper power supply voltage;
one or more selected bus lines of the first source selection bus are driven to a positive voltage, and unselected bus lines of the first source selection bus are driven to ground; and
one or more selected array lines of the first type are driven to a positive voltage.

17. The device as recited in claim 13 wherein:
the first and second decoder circuits are of opposite output polarity in both the first and second modes of operations; and
the first source selection bus is of opposite polarity than the second source selection bus in both the first and second modes of operation, and each of the first and second source selection busses reverses its polarity in the second mode of operation relative to the first mode of operation.

18. The device as recited in claim 17 wherein:
said memory cells are programmable in at least one of the first mode of operation and in the second mode of operation.

19. The device as recited in claim 12 wherein the first decoder circuit maintains the same operating voltage in both the first mode of operation and the second mode of operation.

20. The device as recited in claim 12 wherein, in both the first and second modes of operation, a lower supply voltage for the first decoder circuit has a value which is equal to the lower of the active voltage level and inactive voltage level for the array lines of the first type.

* * * * *